(12) United States Patent
Yamamoto

(10) Patent No.: US 11,757,053 B2
(45) Date of Patent: Sep. 12, 2023

(54) PACKAGE SUBSTRATE HAVING A SACRIFICIAL REGION FOR HEAT SINK ATTACHMENT

(71) Applicant: SONY CORPORATION, Tokyo (JP)

(72) Inventor: Ryuichi Yamamoto, Aichi (JP)

(73) Assignee: SONY CORPORATION, Tokyo (JP)

( * ) Notice: Subject to any disclaimer, the term of this patent is extended or adjusted under 35 U.S.C. 154(b) by 595 days.

(21) Appl. No.: 16/651,425

(22) PCT Filed: Sep. 21, 2018

(86) PCT No.: PCT/JP2018/034980
§ 371 (c)(1),
(2) Date: Mar. 27, 2020

(87) PCT Pub. No.: WO2019/069709
PCT Pub. Date: Apr. 11, 2019

(65) Prior Publication Data
US 2020/0287062 A1    Sep. 10, 2020

(30) Foreign Application Priority Data

Oct. 5, 2017    (JP) .................................. 2017-195128

(51) Int. Cl.
| | | |
|---|---|---|
| *H01L 31/024* | (2014.01) | |
| *H01L 27/146* | (2006.01) | |
| *H01L 31/02* | (2006.01) | |
| *H01L 31/103* | (2006.01) | |
| *H01L 31/18* | (2006.01) | |

(52) U.S. Cl.
CPC ........ *H01L 31/024* (2013.01); *H01L 27/1463* (2013.01); *H01L 27/1469* (2013.01); *H01L 27/14634* (2013.01); *H01L 27/14636* (2013.01); *H01L 27/14643* (2013.01);
(Continued)

(58) Field of Classification Search
CPC ........... H01L 27/14634; H01L 27/1469; H01L 31/1892; H01L 23/13; H01L 23/00–66
See application file for complete search history.

(56) References Cited

FOREIGN PATENT DOCUMENTS

| JP | 62-151777 U | 9/1987 |
|---|---|---|
| JP | 09-102688 A | 4/1997 |

(Continued)

OTHER PUBLICATIONS

International Search Report and Written Opinion of PCT Application No. PCT/JP2018/034980, dated Dec. 18, 2018, 10 pages of ISRWO.

*Primary Examiner* — Kevin Parendo
(74) *Attorney, Agent, or Firm* — CHIP LAW GROUP

(57) ABSTRACT

The present technology relates to a substrate, a manufacturing method, and an electronic apparatus which enable prevention of damage to a semiconductor component. The substrate includes a second region that is disposed inside a first region in which a semiconductor component is arranged and that is surrounded by a connection part and a slit, the connection part having a spot facing on a side of a surface on which the semiconductor component is arranged. The present technology is applicable to manufacturing of electronic apparatuses such as a package substrate on which a semiconductor component that is an image sensor or the like is mounted, a digital camera equipped with a semiconductor component for capturing images by receiving the light, and a mobile phone having an image capturing function.

9 Claims, 30 Drawing Sheets

(52) U.S. Cl.
   CPC ...... *H01L 31/02005* (2013.01); *H01L 31/103* (2013.01); *H01L 31/1892* (2013.01)

(56) References Cited

FOREIGN PATENT DOCUMENTS

| | | |
|---|---|---|
| JP | 09-213848 A | 8/1997 |
| JP | 2000-294669 A | 10/2000 |
| JP | 2003-304038 A | 10/2003 |
| JP | 2005-252183 A | 9/2005 |

FIG. 2
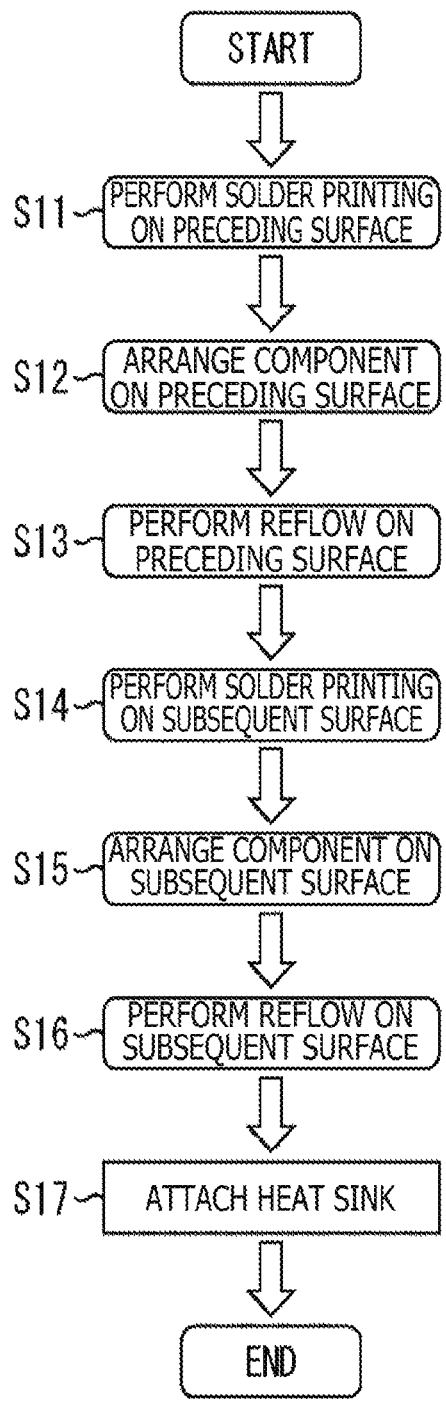
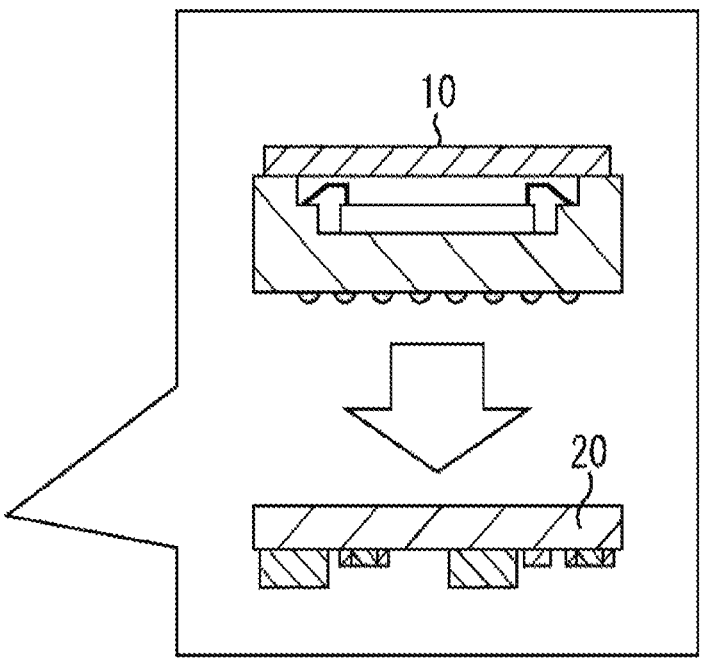

PACKAGE SUBSTRATE HAVING A SACRIFICIAL REGION FOR HEAT SINK ATTACHMENT

CROSS REFERENCE TO RELATED APPLICATIONS

This application is a U.S. National Phase of International Patent Application No. PCT/JP2018/034980 filed on Sep. 21, 2018, which claims priority benefit of Japanese Patent Application No. JP 2017-195128 filed in the Japan Patent Office on Oct. 5, 2017. Each of the above-referenced applications is hereby incorporated herein by reference in its entirety.

TECHNICAL FIELD

The present technology relates to a substrate, a manufacturing method, and an electronic apparatus, and particularly, to a substrate, a manufacturing method, and an electronic apparatus which enable prevention of damage to a semiconductor component, for example.

BACKGROUND ART

For example, PTL 1 discloses a wiring substrate having a structure in which a package substrate is surrounded by a slit and a connection part that has a spot facing.

According to the technology disclosed in PTL 1, it is possible to, when sealing a semiconductor chip mounted on the package substrate, put a sealing agent into only the mounting portion of the semiconductor chip by using surface tension that is generated in the spot facing in the periphery of the semiconductor chip.

CITATION LIST

Patent Literature

[PTL 1]
JP 2000-294669A

SUMMARY

Technical Problem

In a case where, in a package substrate obtained by mounting a semiconductor component on a substrate, a portion of a region in which the semiconductor component is arranged needs to be separated off with a router, a router bit (a tip of the router) may interfere with the semiconductor component mounted on an upper portion of the substrate, whereby the semiconductor component may be damaged.

The present technology has been made in view of the above circumstances, and enables prevention of damage to a semiconductor component.

Solution to Problem

A substrate according to the present technology is a substrate including a second region that is disposed inside a first region in which a semiconductor component is arranged and that is surrounded by a connection part and a slit, the connection part having a spot facing on a side of a surface on which the semiconductor component is arranged.

In the substrate according to the present technology, the second region disposed inside the first region in which the semiconductor component is arranged is surrounded by the slit and the connection part having the spot facing on the side of the surface on which the semiconductor component is arranged.

A manufacturing method according to the present technology is a package substrate manufacturing method including mounting, on a semiconductor component, a substrate including a second region that is disposed inside a first region in which the semiconductor component is arranged and that is surrounded by a connection part and a slit, the connection part having a spot facing on a side of a surface on which the semiconductor component is arranged, and separating off a waste substrate, which is the second region part of the substrate, by cutting the connection part.

In the manufacturing method according to the present technology, the substrate including the second region that is disposed inside the first region in which the semiconductor component is arranged and that is surrounded by the slit and the connection part having the spot facing on the side of the surface on which the semiconductor component is arranged, is mounted on the semiconductor component, and the connection part is cut to separate off the waste substrate, which is the second region part of the substrate, from the substrate.

An electronic apparatus according to the present technology is an electronic apparatus including an optical system that collects light, and an imaging section that captures an image by receiving the light. The imaging section is a package substrate that is obtained by mounting, on a semiconductor component that captures an image by performing photoelectric conversion of the light, a substrate including a second region that is disposed inside a first region in which the semiconductor component is arranged and that is surrounded by a connection part and a slit, the connection part having a spot facing on a side of a surface on which the semiconductor component is arranged, and separating off a waste substrate, which is the second region part of the substrate, from the substrate, by cutting the connection part.

In the electronic apparatus according to the present technology, the imaging section is a package substrate that is obtained by: mounting, on the semiconductor component that captures an image by performing photoelectric conversion of the light, the substrate including the second region that is disposed inside the first region in which the semiconductor component is arranged and that is surrounded by the slit and the connection part having the spot facing on a side of a surface on which the semiconductor component is arranged; and separating off the waste substrate, which is the second region part of the substrate, by cutting the connection part.

Advantageous Effect of Invention

According to the present technology, damage to a semiconductor component can be prevented.

It is to be noted that the effect described above is not necessarily limitative, and any one of the effects disclosed in the present disclosure may be provided.

BRIEF DESCRIPTION OF DRAWINGS

FIG. 2 is a diagram for explaining a package substrate manufacturing method.

DESCRIPTION OF EMBODIMENTS

<1. Configuration Example of Package Substrate>

Figure 1:
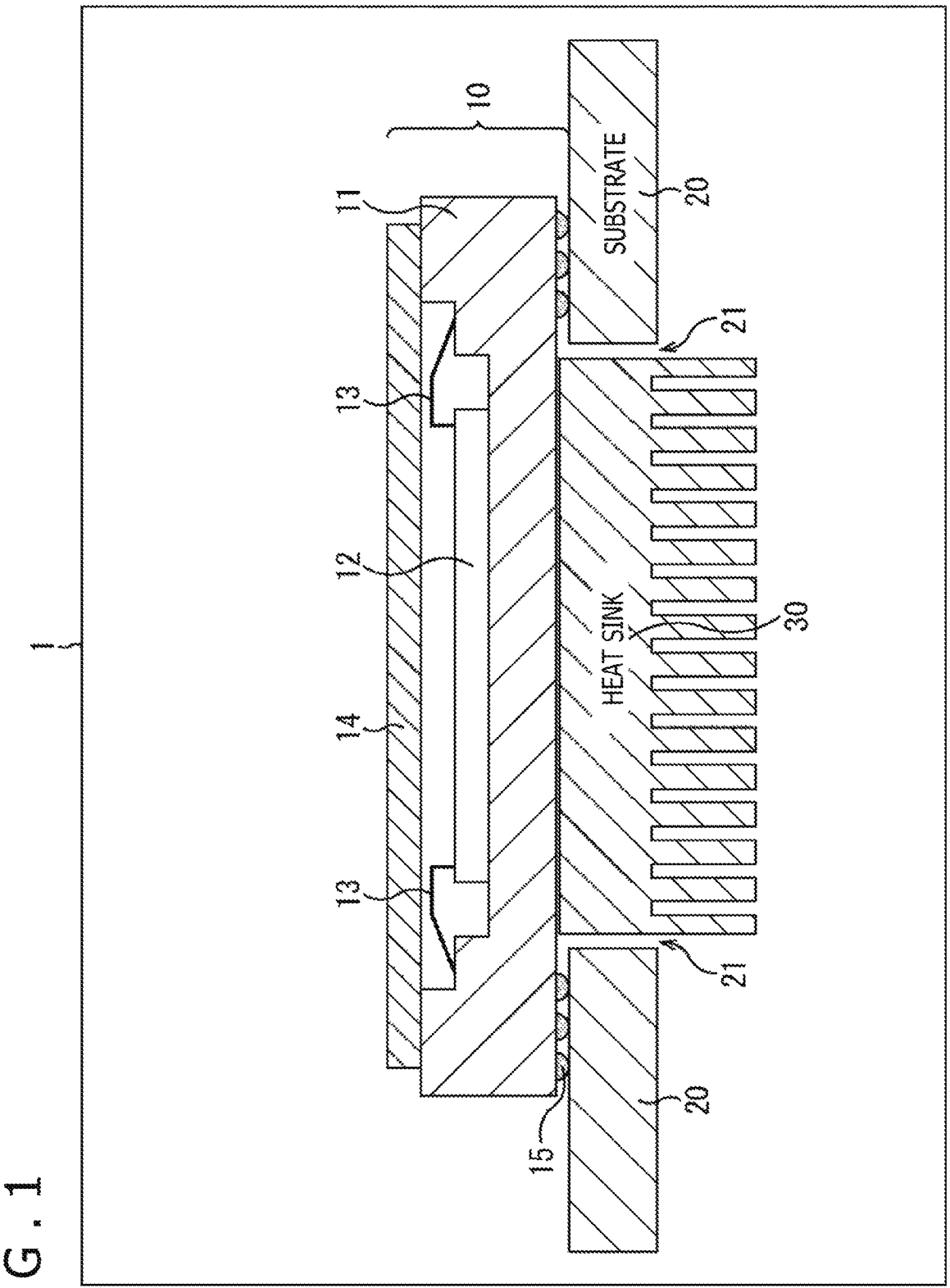
FIG. 1 is a cross-sectional view of a configuration example of a package substrate.

FIG. 1 is a cross-sectional view of a configuration example of a package substrate.

A package substrate (substrate on which mounting has been performed) 1 depicted in FIG. 1 includes a package 10, a substrate 20, and a heat sink 30.

The package 10 is a given semiconductor component. For example, a CMOS (complementary Metal Oxide Semiconductor) image sensor may be used as the package 10.

The package 10 includes a base 11, a sensor substrate 12, a wire 13, a glass 14, and solder balls 15.

In the package 10, the sensor substrate 12 that captures an image by performing photoelectric conversion of light is arranged in a recess formed at a center of the base 11 which uses ceramic, etc., as a raw material and has a flat plate shape, and further, the glass 14 is arranged on the base 11.

The sensor substrate 12 is connected to the solder balls 15 that serve as external electrodes, by wiring bonding using the wire 13 which is made from gold or aluminum (Al), for example. Further, the sensor substrate 12 is sealed in a space that is surrounded by the base 11 and the glass 14 arranged on the base 11.

The plural solder balls 15, which are rear-surface electrodes for electrical connection to the outside, are formed under the base 11. The (sensor substrate 12 of the) package 10 is electrically connected to the substrate 20 by the solder balls 15.

The substrate 20 is made from a glass epoxy or the like, and has a flat plate shape having an area larger than that of the package 10. The package 10 is mounted on a center portion of the substrate 20, and a portion within a region in which the package 10 is mounted on the substrate 20, is separated off, whereby an opening 21 is formed. A portion of the bottom surface of the package 10 is exposed from the opening 21 of the substrate 20. The heat sink 30 that radiates heat generated in the package 10 is attached so as to be in contact with the exposed portion of the package 10.

FIG. 2 is a diagram for explaining a manufacturing method for the package substrate 1.

A manufacturing device (not depicted) for manufacturing the package substrate 1 separates off a portion of the substrate 20, thereby forms the opening 21 (FIG. 1) for attaching the heat sink 30 to the package 10. In step S11, while a preceding surface (a surface to be precedingly subjected to reflow heating) which is one of two flat surfaces of the substrate 20 is oriented upward, the manufacturing device performs solder printing on the preceding surface. Then, the process proceeds to step S12.

In step S12, the manufacturing device arranges, in an area, of the preceding surface of the substrate 20, where the solder printing has been performed, electronic components such as relatively light electronic components to be mounted on the preceding surface. Then, the process proceeds to step S13.

In step S13, the manufacturing device performs reflow heating on the preceding surface of the substrate 20 such that the electronic components arranged on the preceding surface of the substrate 20 are solder-bonded. Then, the process proceeds to step S14.

In step S14, while a subsequent surface (a surface to be subsequently subjected to reflow heating) which is the other surface of the two flat surfaces of the substrate 20 is oriented upward, the manufacturing device performs solder printing on the subsequent surface. Then, the process proceeds to step S15.

In step S15, the manufacturing device arranges, in an area, of the subsequent surface of the substrate 20, where the solder printing has been performed, the remaining electronic components including the package 10. Then, the process proceeds to step S16.

In step S16, the manufacturing device performs reflow heating on the subsequent surface of the substrate 20 such that the electronic components arranged on the subsequent surface of the substrate 20 are solder-bonded, while preventing the electronic components solder-bonded to the preceding surface of the substrate 20 from dropping. Then, the process proceeds to step S17.

In step S17, the manufacturing device attaches the heat sink 30 on a lower portion of the package 10 exposed from the opening 21 of the substrate 20. Thus, the package substrate 1 is completed.

Here, in the case where the weight of the package 10 is large, the solder collapses due to the weight of the package 10 in the manufacturing method depicted in FIG. 2 because solder bonding is performed while the package 10 is arranged above the substrate 20 during reflow heating on the subsequent surface of the substrate 20. This may cause a defect such as a solder bridge in which a collapsed solder causes a short circuit between adjacent terminals.

<2. Configuration Example of First Embodiment of Substrate>

Figure 3:
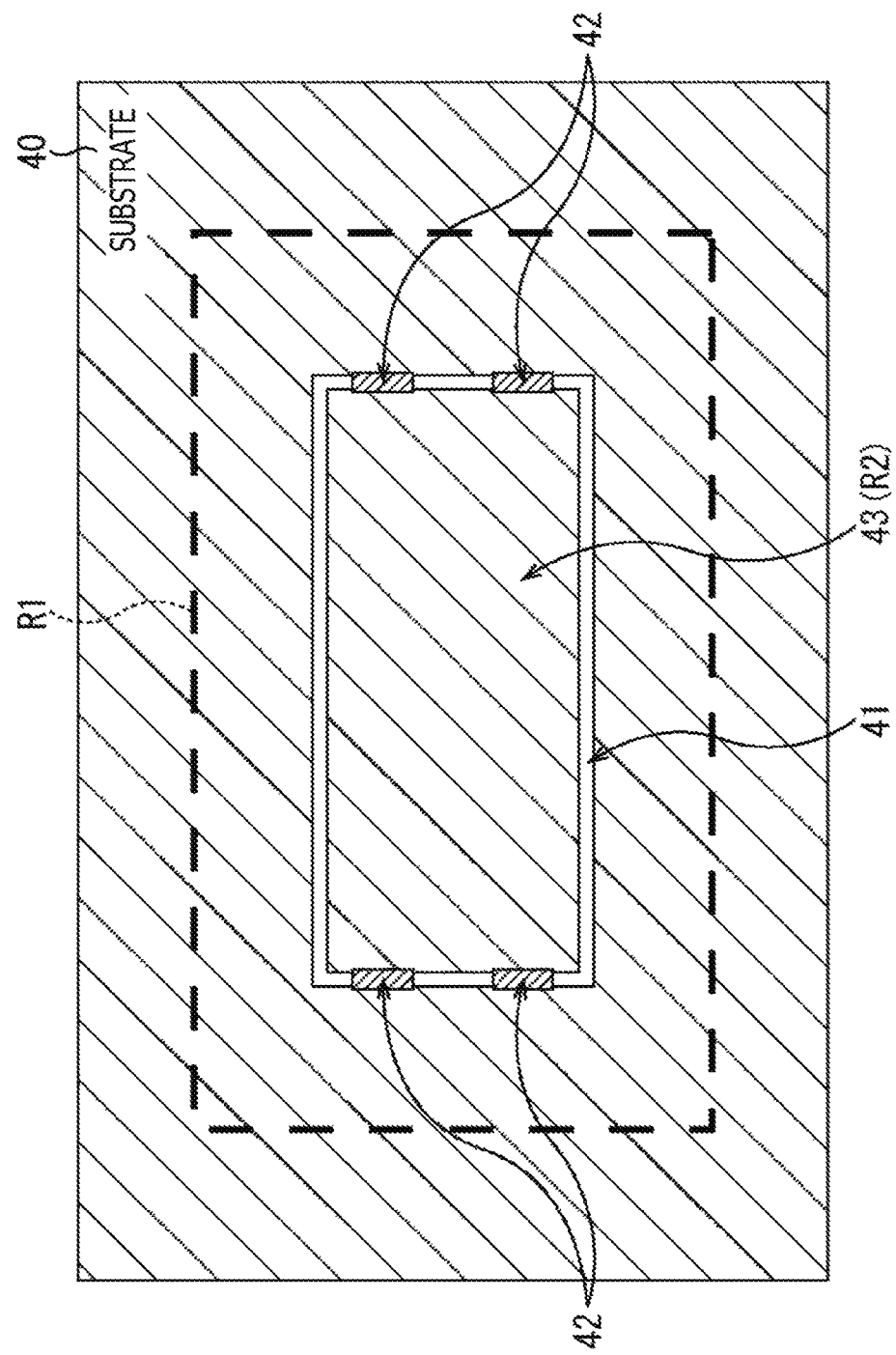
FIG. 3 is a top view of a configuration example of a first embodiment of a substrate to which the present technology has been applied.

FIG. 3 is a top view of a configuration example of the substrate according to a first embodiment to which the present technology has been applied.

A substrate 40 is made from glass epoxy, for example, and has a flat plate shape. In the substrate 40, a suction region (second region) R2 surrounded by a slit 41 and connection parts 42 is provided inside an arrangement region (first region) R1 in which the package 10 is arranged.

That is, the slit 41 is formed in the periphery of the suction region R2 of the substrate 40 excluding the connection parts 42. Therefore, the suction region R2 part of the substrate 40 is kept (fixed) at the outside of the suction region R2 by the connection parts 42.

The substrate 40 is moved to a point above the package 10, and is mounted thereon, as described later. In order to be moved in this manner, the substrate 40 needs to be suctioned. The suction region R2 is suctioned when the substrate 40 is moved. Accordingly, the suction region R2 is located in a center region of the substrate 40 from the viewpoint of, for example, maintaining a balance in the substrate 40 when suctioning the substrate 40.

In a manufacturing procedure for a package substrate in which semiconductor components including the package 10, etc., are mounted on the substrate 40, the connection parts 42 are cut to separate off, as a waste substrate 43, the suction region R2 part of the substrate 40 from the substrate 40.

It is to be noted that, although the suction region R2 is a rectangular region in FIG. 3, the suction region R2 is not limited to a rectangular region. For example, a region having a circular shape or the like may be used as the suction region R2.

Figure 4:
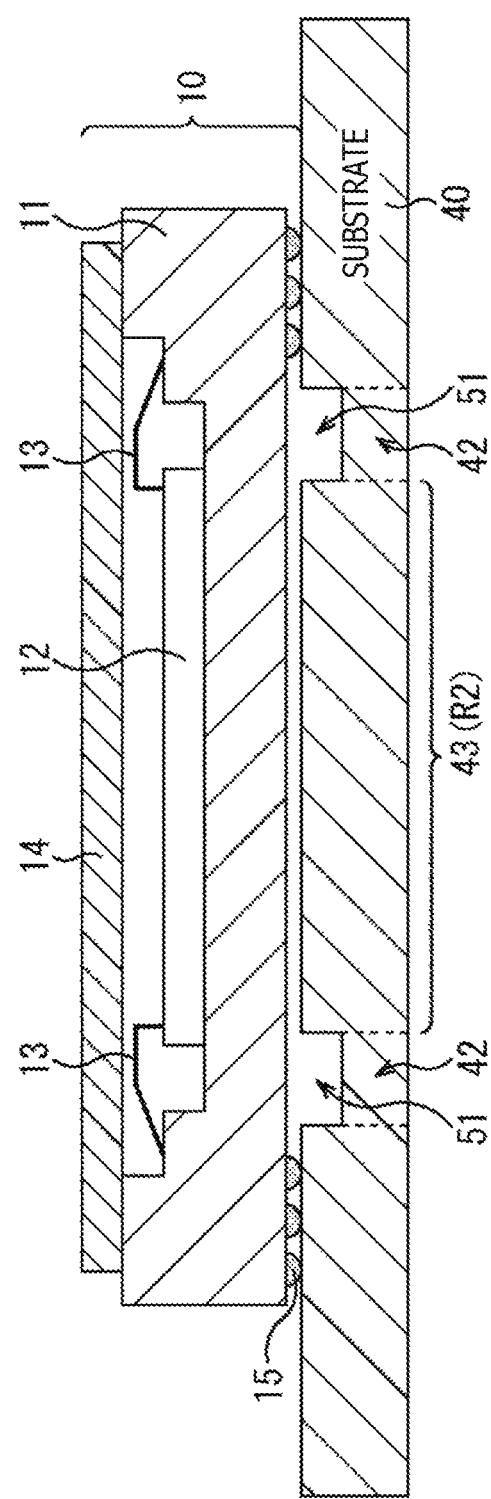
FIG. 4 is a cross-sectional view of a configuration example of a substrate having a package mounted thereon.

FIG. 4 is a cross-sectional view of a configuration example of the substrate 40 with the package 10 mounted thereon.

Each of the connection parts 42 of the substrate 40 has a spot facing (recess) 51 on the side of a surface on which the package 10 is arranged (mounted). In FIG. 4, the spot facing 51 is provided in the entirety of the side, of each of the connection parts 42, of the surface on which the package 10 is mounted. A depth of the recess serving as the spot facing 51 is approximately a half of the thickness of the substrate 40.

In the substrate 40 thus configured, in the state where the package 10 is mounted on the substrate 40, a gap formed of the spot facing 51 is formed between each of the connection parts 42 of the substrate 40 and the package 10. Accordingly, in the state where the package 10 is mounted on the substrate 40, when the connection parts 42 are cut with use of a cutting tool such as a router in order to separate off the waste substrate 43 from the substrate 40, damage to the package 10 due to an interference (contact) of the router with the package 10 can be prevented.

The substrate 40 can be manufactured by, for example, forming a hole as the slit 41 in a flat plate-like substrate so as to leave some parts as the connection parts 42, and shaving off a portion of each of the connection parts 42 so as to form the spot facing 51.

Figure 5:
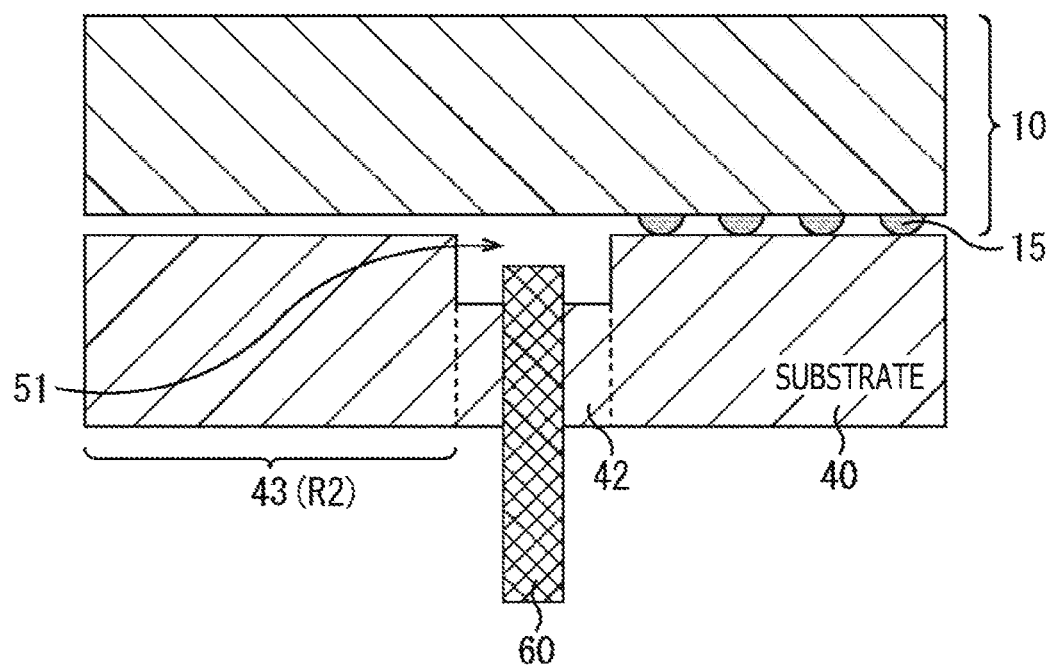
FIG. 5 is a cross-sectional view of a situation of cutting a connection part of a substrate having a package mounted thereon.

FIG. 5 is a cross-sectional view of a situation of cutting the connection part 42 of the substrate 40 having the package 10 mounted thereon.

In FIG. 5, in the connection part 42 of the substrate 40, a router 60 is inserted from the lower portion of the substrate 40 on the upper portion of which the package 10 is mounted, to a depth (e.g., approximately 70 to 90 percent of the thickness of the substrate 40) that is less than the thickness of the substrate 40 but is greater than the thickness of the connection part 42.

Since the connection part 42 has the spot facing 51, the router 60 does not need to be inserted to a depth, in the connection part 42, greater than the thickness of the substrate 40. When the router 60 is inserted to a depth greater than the thickness of the connection part 42, the connection part 42 can be cut without involving an interfere of the router 60 with the package 10. Therefore, in the state where the package 10 is mounted on the substrate 40, the connection part 42 can be cut to separate off the waste substrate 43 from the substrate 40 without causing damage to the package 10.

Figure 6:
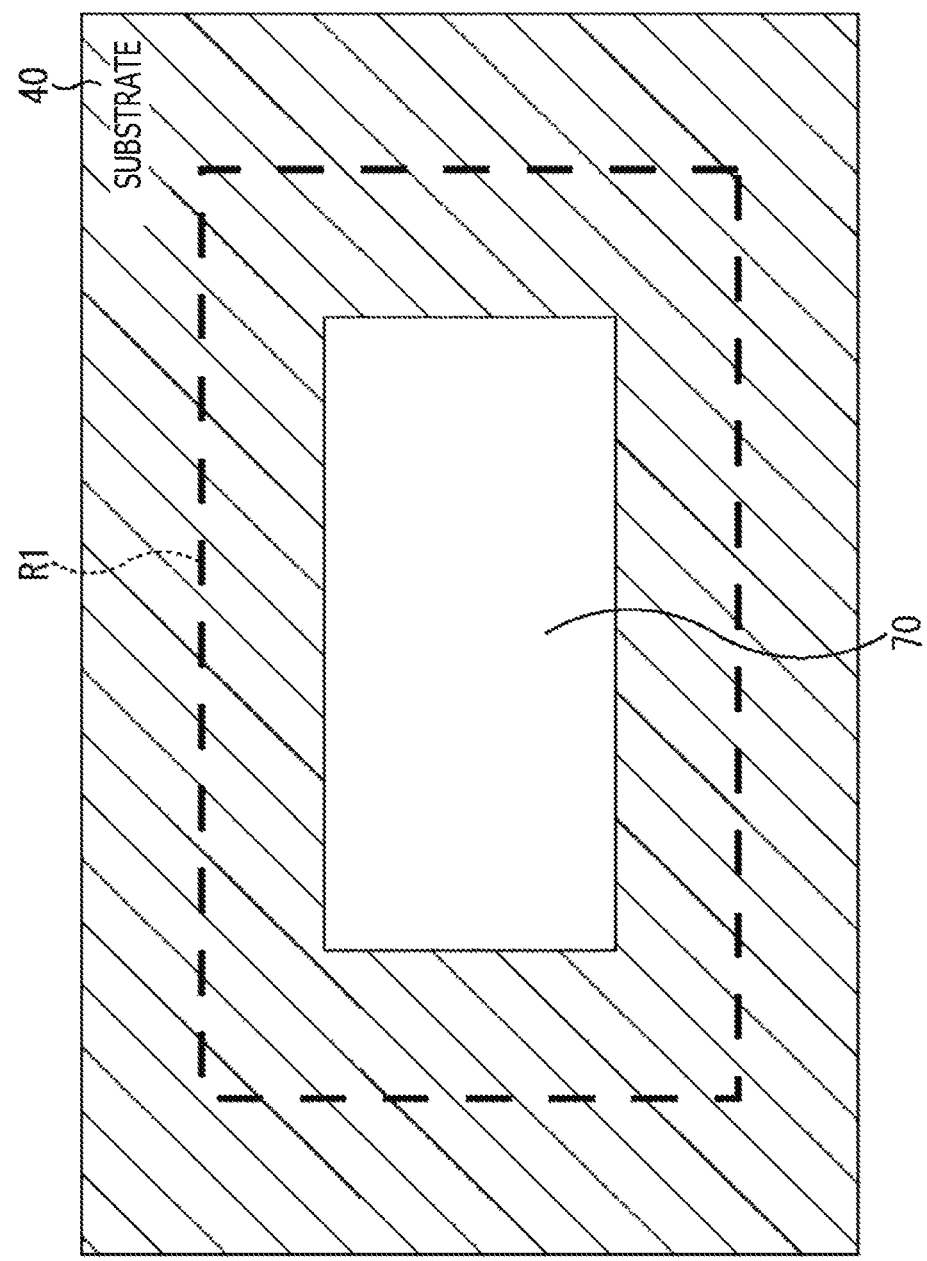
FIG. 6 is a top view of a configuration example of a substrate from which a waste substrate has been separated off.

FIG. 6 is a top view of a configuration example of the substrate 40 from which the waste substrate 43 has been separated off.

After the waste substrate 43 is separated off from the substrate 40, an area of the substrate 40 where the waste substrate 43 was disposed becomes an opening 70. In the case where the package 10 is mounted on the substrate 40, a lower portion of the package 10 mounted on the substrate 40 is exposed from the opening 70. The heat sink 30 is attached to the lower portion of the package 10 exposed from the opening 70.

Figure 7:
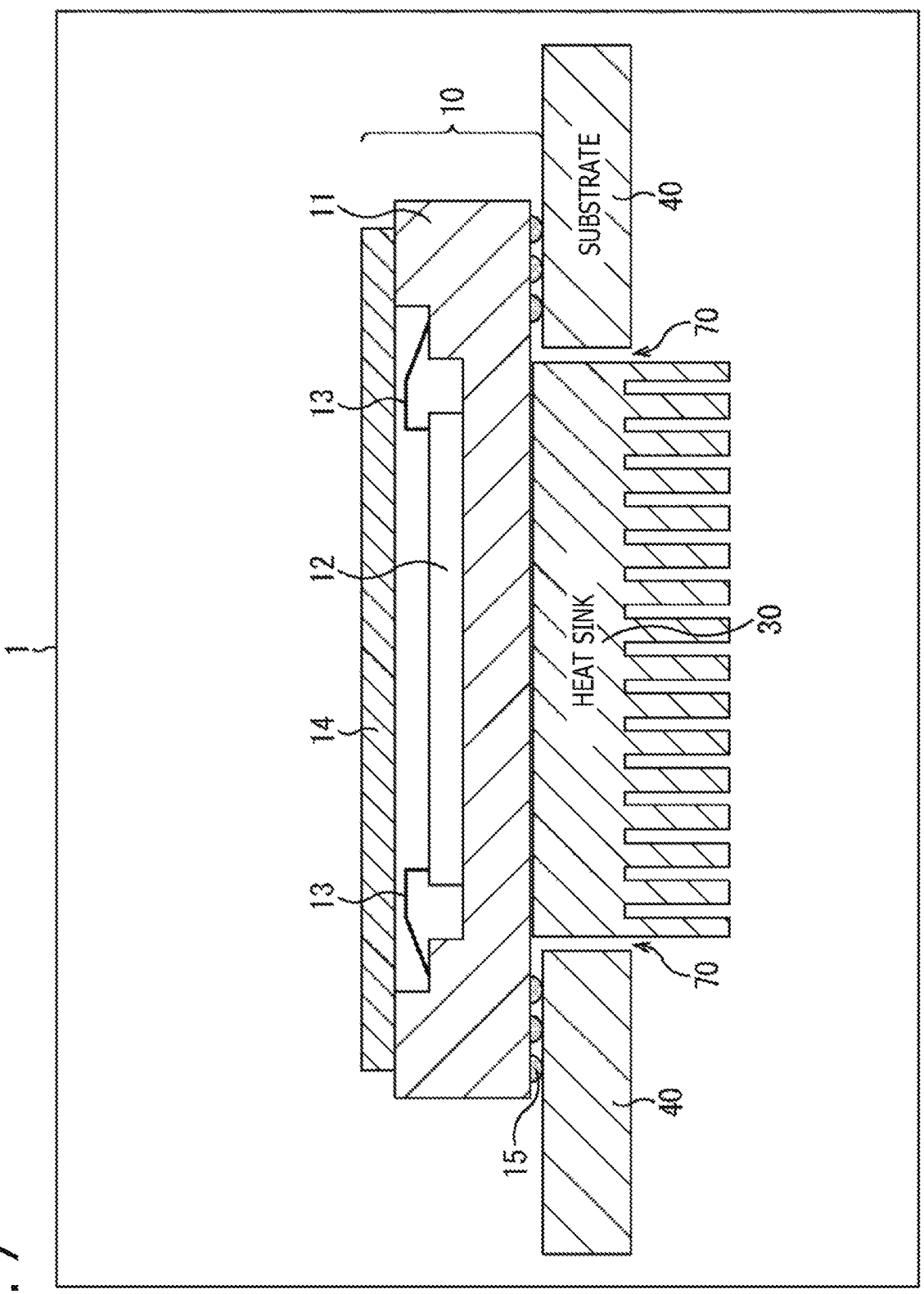
FIG. 7 is a cross-sectional view of a configuration example of one embodiment of a package substrate to which the present technology has been applied.

FIG. 7 is a cross-sectional view of a configuration example of one embodiment of a package substrate to which the present technology has been applied.

That is, FIG. 7 is a cross-sectional view of a configuration example of a package substrate obtained by separating off the waste substrate 43 from the substrate 40 having the package 10 mounted thereon and by attaching the heat sink 30 to the substrate 40.

It is to be noted that a component in FIG. 7 corresponding to that in FIG. 1 is denoted by the same reference symbol, and hereinafter, an explanation thereof will be omitted, as appropriate.

In FIG. 7, a package substrate 80 includes the package 10, the heat sink 30, and the substrate 40.

Therefore, regarding the point of including the package 10 and the heat sink 30, the package substrate 80 is the same as the package substrate 1 in FIG. 1. However, the package substrate 80 is different from the package substrate 1 in a point of including the substrate 40 in place of the substrate 20.

Figure 8:
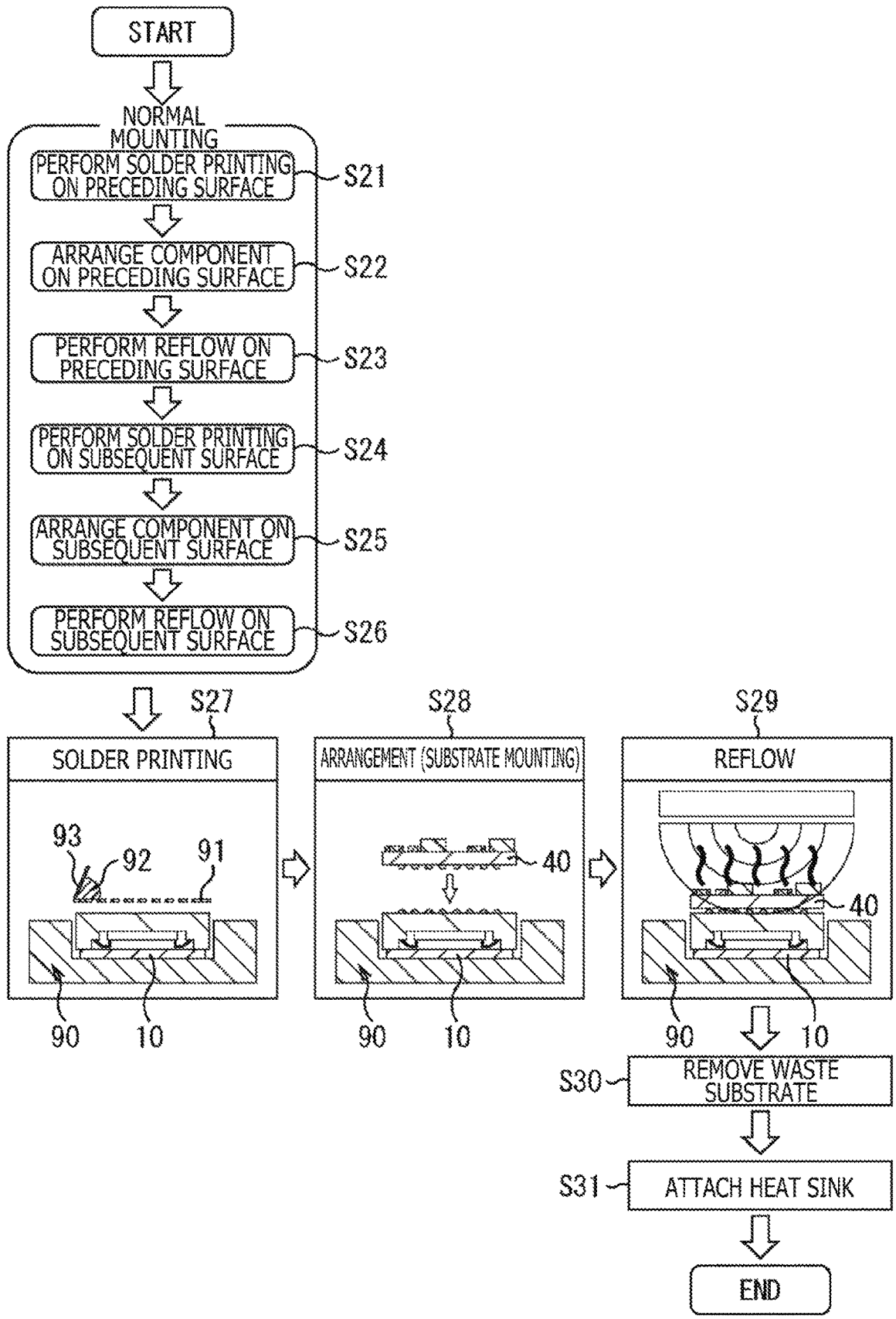
FIG. 8 is a diagram for explaining a package substrate manufacturing method.

FIG. 8 is a diagram for explaining a manufacturing method for the package substrate 80.

In step S21, a manufacturing device (not depicted) performs solder printing on a preceding surface, which is the spot facing 51-provided surface of the substrate 40, while the preceding surface is oriented upward. Then, the process proceeds to step S22.

In step S22, the manufacturing device arranges, in an area, of the preceding surface of the substrate 40, where solder printing has been performed, electronic components such as relatively light electronic components to be mounted on the preceding surface. Then, the process proceeds to step S23.

In step S23, the manufacturing device performs reflow heating on the preceding surface of the substrate 40 such that the electronic components arranged on the substrate 40 are solder-bonded. Accordingly, the electronic components are mounted on the preceding surface of the substrate 40. Then, the process proceeds to step S24 from step S23.

In step S24, the manufacturing device performs solder printing on a subsequent surface, which is opposite to the spot facing 51-provided surface of the substrate 40, while the subsequent surface is oriented upward. Then, the process proceeds to step S25.

In step S25, the manufacturing device arranges, in an area, of the subsequent surface of the substrate 40, where solder printing has been performed, the remaining electronic components excluding the package 10. Then, the process proceeds to step S26.

In step S26, the manufacturing device performs reflow heating on the subsequent surface of the substrate 40 such that the electronic components arranged on the subsequent surface of the substrate 40 are solder-bonded, while preventing the electronic components mounted on the preceding surface of the substrate 40 from dropping. Accordingly, the electronic components are mounted on the subsequent surface of the substrate 40. Then, the process proceeds to step S27 from step S26.

Here, since the electronic components which are relatively light are mounted on the preceding surface of the substrate 40, the electronic components mounted on the preceding surface oriented downward can be prevented from dropping during reflow heating which is performed with the subsequent surface of the substrate 40 oriented upward.

In step S27, the manufacturing device arranges and fixes, to a jig 90 that is for positioning components, the package 10 having the solder bonded surface oriented upward. Also, the manufacturing device arranges, on the solder bonded surface of the package 10 fixed to the jig 90, a screen 91 in which a predetermined pattern hole is formed, and spreads a cream solder 92 over the screen 91 by using a squeegee 93. Accordingly, solder printing is performed on the package 10. Then, the process proceeds to step S28 from step S27.

In step S28, the manufacturing device suctions the suction region R2 part to become the waste substrate 43 in the subsequent surface of the substrate 40, moves the substrate 40 to a point above the package 10 (to a side on which solder printing has been performed) fixed to the jig 90, and arranges the substrate 40 on the package 10 (substrate mounting). Then, the process proceeds to step S29 from step S28.

In step S29, the manufacturing device performs reflow heating on the substrate 40 arranged on the package 10 such that the package 10 and the substrate 40 are solder-bonded together. Accordingly, the substrate 40 is mounted on the package 10. Then, the process proceeds to step S30 from step S29.

The aforementioned mounting method for mounting the substrate 40 on the package 10, instead of mounting the package 10 on the substrate 40, can be referred to as inverted mounting.

In step S30, the manufacturing device cuts the connection part 42 of the substrate 40 by using a cutting tool such as the router 60 (FIG. 5), and separates off (removes), from the substrate 40, the waste substrate 43 (part maintained as the suction region R2) maintained in the substrate 40 by the connection part 42. Then, the process proceeds to step S31 from step S30.

In step S31, the manufacturing device attaches the heat sink 30 to a lower portion of the package 10 exposed from the opening 70 which is formed by removing the waste substrate 43 from the substrate 40. Accordingly, the package substrate 80 is completed.

In the manufacturing method depicted in FIG. 2, the package 10 is mounted on the substrate 20. Therefore, in the case where the weight of the package 10 is large, the solder collapses due to the weight of the package 10. This may cause a defect such as a solder bridge.

On the other hand, in the manufacturing method in FIG. 8, inverted mounting of mounting the substrate 40 on the package 10 is performed. Therefore, even in the case where the weight of the package 10 is large, the solder does not collapse so that occurrence of a defect such as a solder bridge can be prevented.

However, in the inverted mounting, the substrate 40 needs to be suctioned to be moved to a point above the package 10. Accordingly, the suction region R2 for suctioning the substrate 40 needs to be left in the substrate 40. That is, the waste substrate 43 which is the suction region R2 part needs to be left without being separated off from the substrate 40 until the substrate 40 is mounted on the package 10. In addition, after the substrate 40 is mounted on the package 10, the waste substrate 43 needs to be separated off from the substrate 40 in order to form the opening 70 for attaching the heat sink 30.

Here, in the case where no spot facing 51 is provided to the connection part 42, when the waste substrate 43 is to be separated off from the substrate 40 with use of a cutting tool such as the router 60, there are little gap between (the connection part 42 of) the substrate 40 and the package 10. Therefore, if the router 60 is inserted into the connection part 42, the router 60 does not pass through the connection part 42 and a portion of the connection part 42 may be left so that the connection part 42 cannot be completely cut. On the other hand, if the router 60 is inserted to the connection part 42 so as to pass through the connection part 42, the router 60 having passed through the connection part 42 may interfere with the package 10 so that the package 10 may be damaged.

In contrast, in the case where the spot facing 51 is provided to the connection part 42, a gap is formed between the package 10 and the substrate 40 (connection part 42). Therefore, even if the router 60 is inserted to the connection part 42 so as to pass through the connection part 42, the router 60 having passed through the connection part 42 can be prevented from interfering with the package 10, and further, the connection part 42 can be cut to separate off the waste substrate 43 from the substrate 40.

That is, with the substrate 40, a clearance (gap) between the package 10 and the router 60 can be ensured by the spot facing 51 provided to the connection part 42 when the connection part 42 is to be cut with the router 60, even in the case where a standoff (a gap formed by the solder balls 15, etc., between the substrate 40 and the package 10) between the package 10 and the substrate 40 is small. Accordingly, when the connection part 42 is cut with the router 60 to separate off the waste substrate 43 from the substrate 40, the router 60 can be prevented from interfering with and damaging the package 10.

Further, with the substrate 40, a gap between the package 10 and the substrate 40 is formed by the spot facing 51 of the connection part 42 when the substrate 40 is mounted on the package 10. Accordingly, a demand for the accuracy of a depth by which the router 60 is inserted into the connection part 42 can be mitigated.

It is to be noted that, for example, regarding the CMOS image sensor, the CMOS image sensor is expected to be upsized and to become heavier due to an increase in the image quality of images to be captured by CMOS image sensors. The substrate 40 in FIGS. 3 and 4 and the manufacturing method in FIG. 8 are effective particularly for the case where the package 10 is a CMOS image sensor, which is heavy, or is another semiconductor component.

<3. Configuration Example of Second Embodiment of Substrate>

Figure 9:
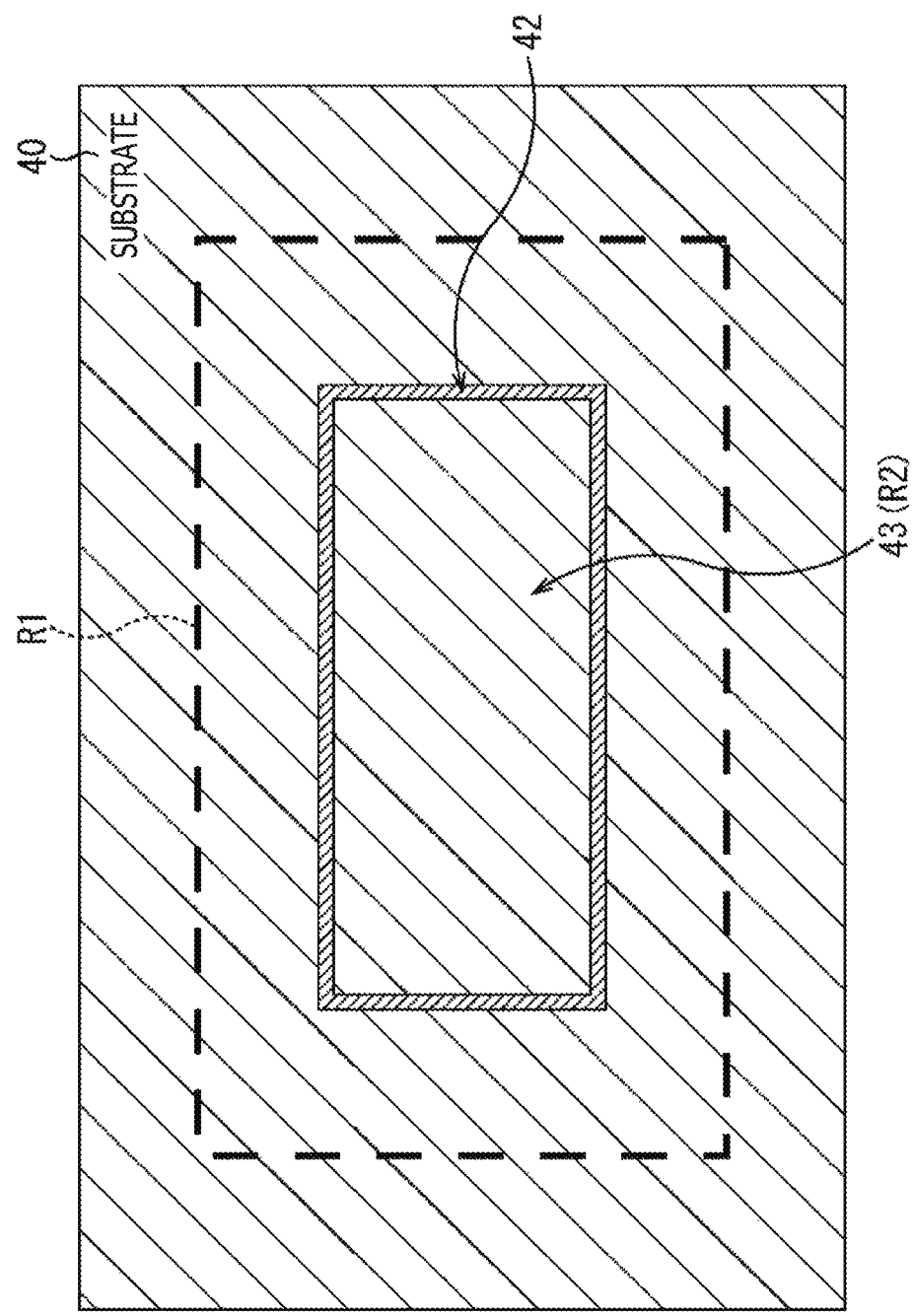
FIG. 9 is a top view of a configuration example of a second embodiment of a substrate.

FIG. 9 is a top view of a configuration example of a second embodiment of the substrate 40.

It is to be noted that a component in FIG. 9 corresponding to that in FIG. 3 is denoted by the same reference symbol, and hereinafter, an explanation thereof will be omitted, as appropriate.

Regarding the point of including the suction region R2 inside the arrangement region R1 in which the package 10 is arranged, the substrate 40 in FIG. 9 is the same as that in FIG. 3.

However, the substrate 40 in FIG. 9 is different from that in FIG. 3 in that the suction region R2 in FIG. 9 is surrounded only by the connection part 42 having the spot facing 51 whereas the suction region R2 in FIG. 3 surrounded by the slit 41 and the connection parts 42 having the spot facings 51.

Also with the substrate 40 in FIG. 9, a gap between the package 10 and the substrate 40 is ensured, as in FIG. 3, by the spot facing 51. Consequently, an effect similar to that in FIG. 3 can be provided.

<4. Configuration Example of Third Embodiment of Substrate>

Figure 10:
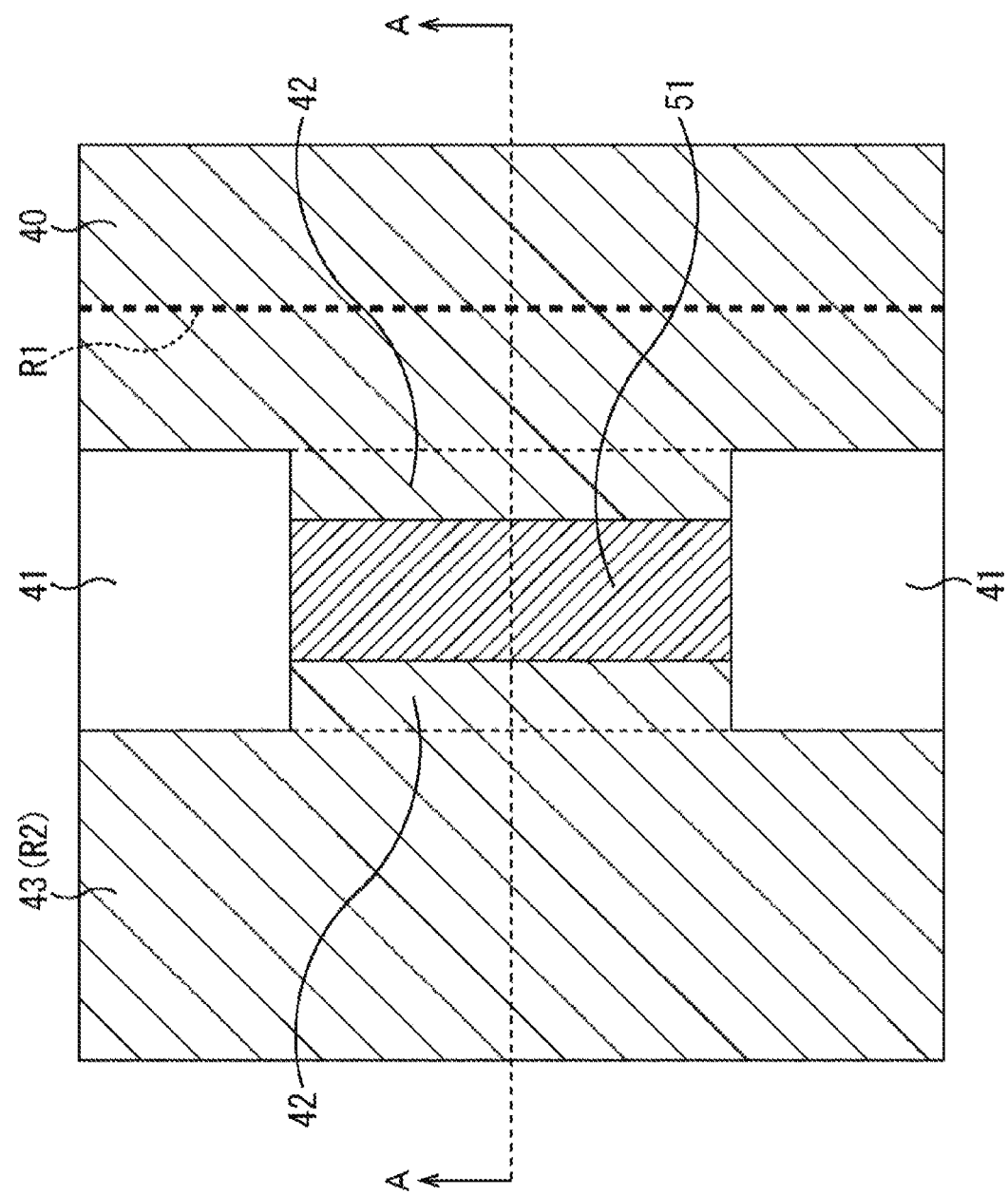
FIG. 10 depicts a configuration example of a third embodiment of a substrate, and is a top view of a portion of the substrate.

FIG. 10 depicts a third embodiment of the substrate 40, and is a top view of a portion of the substrate 40. In addition, FIG. 11 is a cross-sectional view taken along line A-A in FIG. 10.

It is to be noted that a component in FIGS. 10 and 11 corresponding to that in FIG. 3 is denoted by the same reference symbol, and hereinafter, an explanation thereof will be omitted, as appropriate.

Figure 11:
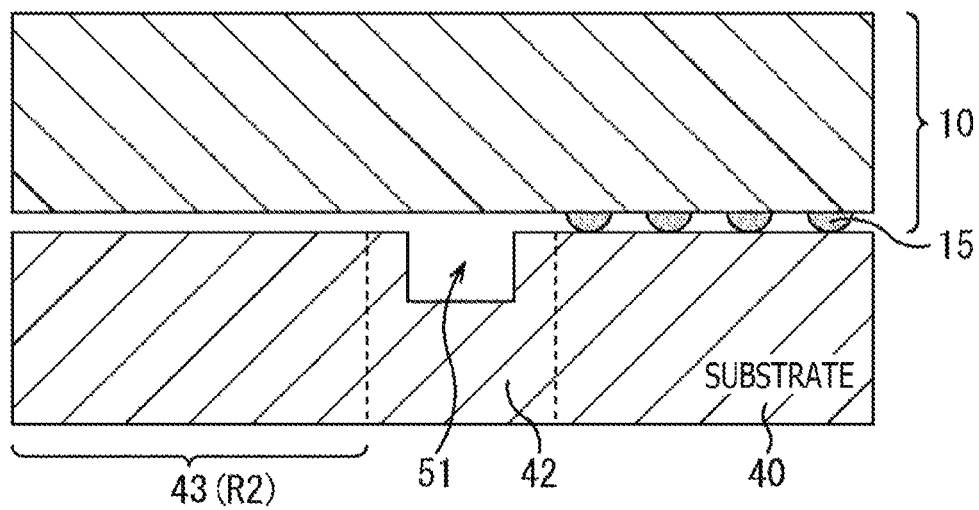
FIG. 11 is a cross-sectional view taken along line A-A in FIG. 10.

Regarding the point of including, inside the arrangement region R1 in which the package 10 is arranged, the suction region R2 surrounded by the slit 41 and the connection parts 42 having the spot facings 51, the substrate 40 in FIGS. 10 and 11 is the same as that in FIG. 3.

However, the substrate 40 in FIGS. 10 and 11 is different from the substrate 40 in FIG. 3 in that, in FIGS. 10 and 11, the spot facing 51 is provided not on the entire side of the surface, of the connection part 42, on which the package 10 is mounted, but is provided on only a portion of the connection part 42, whereas, in FIG. 3, the spot facings 51 are each provided in the entirety of the corresponding connection part 42.

Here, a length of the connection part 42 along a boundary with respect to the suction region R2 is defined by a length of the connection part 42 connecting the suction region R2 part of the substrate 40 to the outside of the suction region R2, and a width of the connection part 42 is defined by a length of the connection part 42 in a direction (a length in a width direction of the slit 41) perpendicular to a boundary with respect to the suction region R2. The same applies to the spot facing 51.

The spot facing 51 having the same length as the connection part 42 but having a width (which is approximately a half of the width of the connection part 42) narrower than the width of the connection part 42, is provided to the side of a surface, of the connection part 42 of the substrate 40 in FIG. 10, on which the package 10 is mounted. Also with the substrate 40 in FIG. 10, a gap between the package 10 and the substrate 40 is ensured by the spot facing 51, as in FIG. 3. Consequently, an effect similar to that in FIG. 3 can be provided.

As described above, a width of the spot facing 51 provided to the connection part 42 may be narrower than the width of the connection part 42.

Further, in FIGS. 10 and 11, the spot facing 51 is provided at a center portion in a width direction of the connection part 42. However, the spot facing 51 may be provided at a side closer to the waste substrate 43 or to a side closer to the outside of the waste substrate 43.

Moreover, in the substrate 40 in FIGS. 10 and 11, the suction region R2 is surrounded by the slit 41 and the connection part 42. However, the suction region R2 may be surrounded only by the connection part 42 having the spot facing 51, as in FIG. 9.

It is to be noted that, although a CMOS image sensor is used as the package 10 in the present embodiment, a freely-selected semiconductor component other than the CMOS image sensor can be used as the package 10.

<5. Example of Application to Electronic Apparatus>

The package substrate 80 in FIG. 7 is applicable to various electronic apparatuses including an imaging apparatus such as a digital still camera or a digital video camera, a mobile phone having an image capturing function, and another apparatus having an image capturing function, for example.

Figure 12:
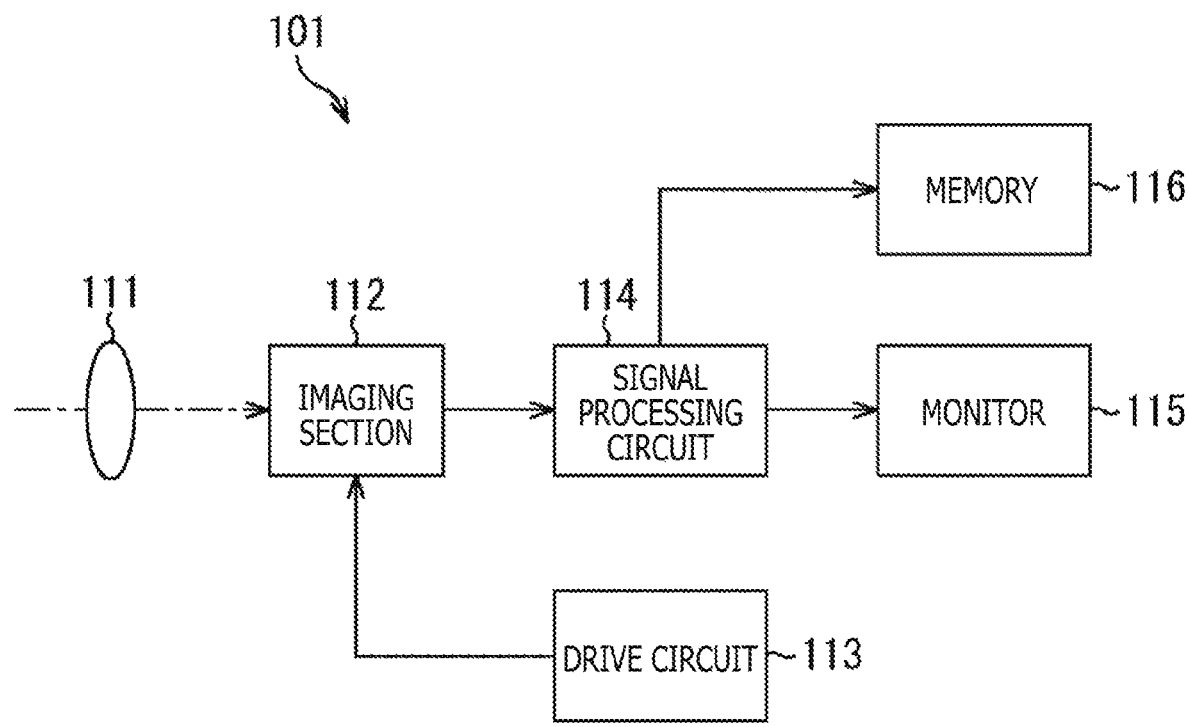
FIG. 12 is a block diagram depicting a configuration example of an imaging apparatus as an electronic apparatus to which the present technology has been applied.

FIG. 12 is a block diagram depicting a configuration example of an imaging apparatus as an electronic apparatus to which the present technology has been applied.

An imaging apparatus 101 depicted in FIG. 12 includes an optical system 111, an imaging section 112, a control circuit 113, a signal processing circuit 114, a monitor 115, and a memory 116, and is capable of capturing still images and movies.

The optical system 111 includes one or more lenses, and guides light (incident light) from a subject to the imaging section 112, and forms an image on a light receiving surface of the imaging section 112.

The imaging section 112 stores signal charges for a certain period of time in accordance with light which is formed on the light receiving surface through the optical system 111. The signal charges stored in the imaging section 112 is transferred and outputted in accordance with a drive signal (timing signal) supplied from the control circuit 113.

The control circuit 113 drives the imaging section 112 by outputting a drive signal for controlling a transfer operation of the imaging section 112.

The signal processing circuit 114 performs various kinds of signal processing on the signal charges outputted from the imaging section 112. An image (image data) obtained by the signal processing performed by the signal processing circuit 114 is supplied to the monitor 115 and displayed thereon, or is supplied to the memory 116 and recorded therein.

The present technology is applicable to the imaging apparatus 101 thus configured. That is, in the imaging apparatus 101, the imaging section 112 can be formed of the package substrate 80 in FIG. 7 using a CMOS image sensor as the package 10, for example. When the imaging section 112 is formed of the package substrate 80 in FIG. 7, damage to the package 10 can be prevented during manufacturing of the imaging section 112.

<6. Application to Mobile Body>

A technology according to the present disclosure (the present technology) is applicable to various products. For example, a technology according to the present disclosure may be realized by an apparatus which is mounted on any one of mobile bodies such as a vehicle, an electric vehicle, a hybrid electric vehicle, a motorcycle, a bicycle, a personal mobility, an aircraft, a drone, a ship, and a robot.

Figure 13:
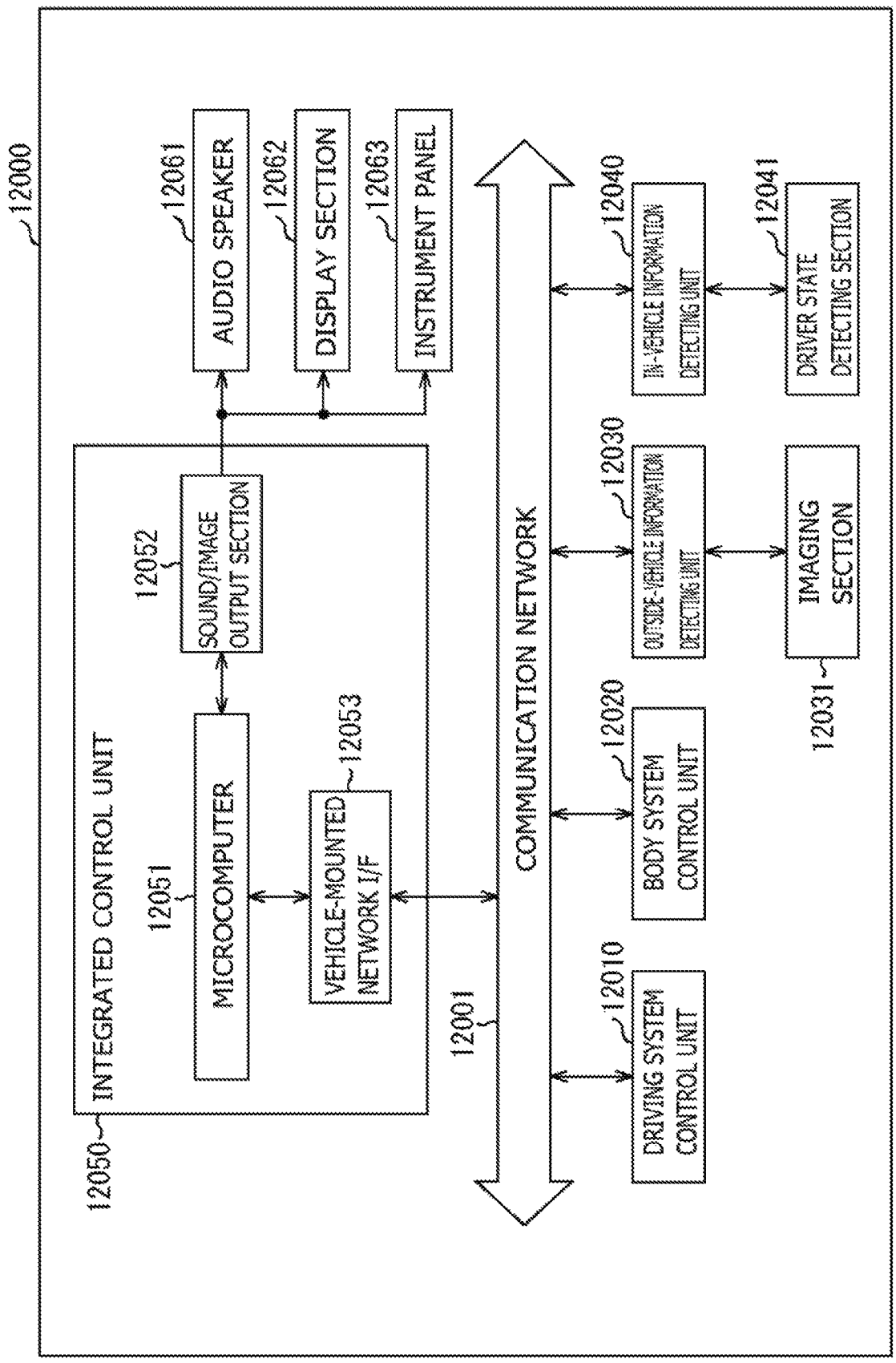
FIG. 13 is a block diagram depicting an example of schematic configuration of a vehicle control system.

FIG. 13 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 13, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 13, an audio speaker 12061, a display section 12062, and an instrument panel 12063 are illustrated as the output device. The display section 12062 may, for example, include at least one of an on-board display and a head-up display.

Figure 14:
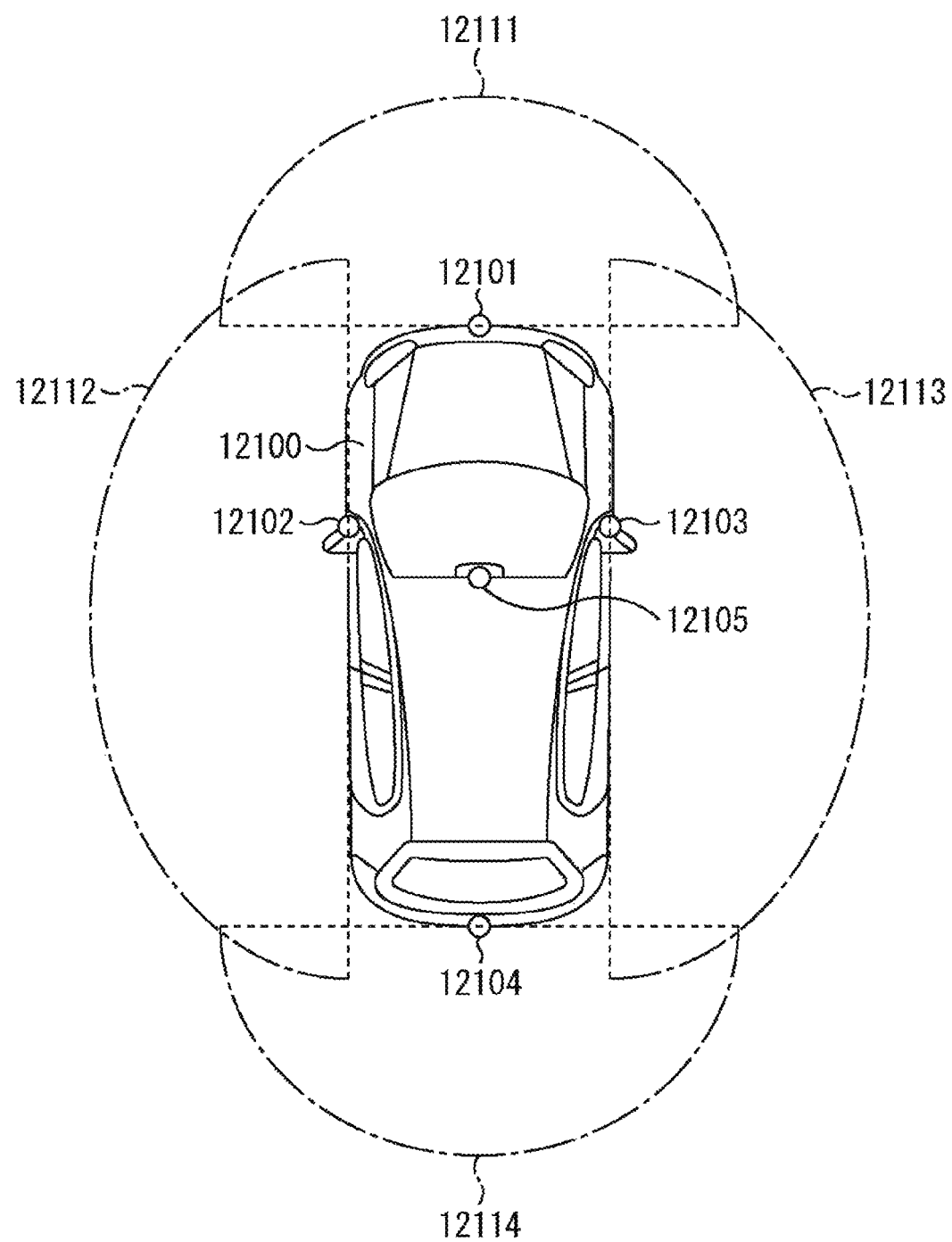
FIG. 14 is a diagram of assistance in explaining an example of installation positions of an outside-vehicle information detecting section and an imaging section.

FIG. 14 is a diagram depicting an example of the installation position of the imaging section 12031.

In FIG. 14, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 14 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object.

When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of a vehicle control system to which a technology according to the present disclosure is applicable has been explained above. A technology according to the present disclosure is applicable to the imaging section 12031, etc., among the aforementioned sections. Specifically, the package substrate 50 in FIG. 4 or the package substrate 80 in FIG. 7 is applicable to the imaging section 12031. When a technology according to the present disclosure is applied to the imaging section 12031, damage to a semiconductor component during manufacturing of the imaging section 12031 can be prevented.

<7. Cross-Sectional Configuration Example of Solid-State Imaging Apparatus to which Technology According to Present Disclosure is Applicable>

Figure 15:
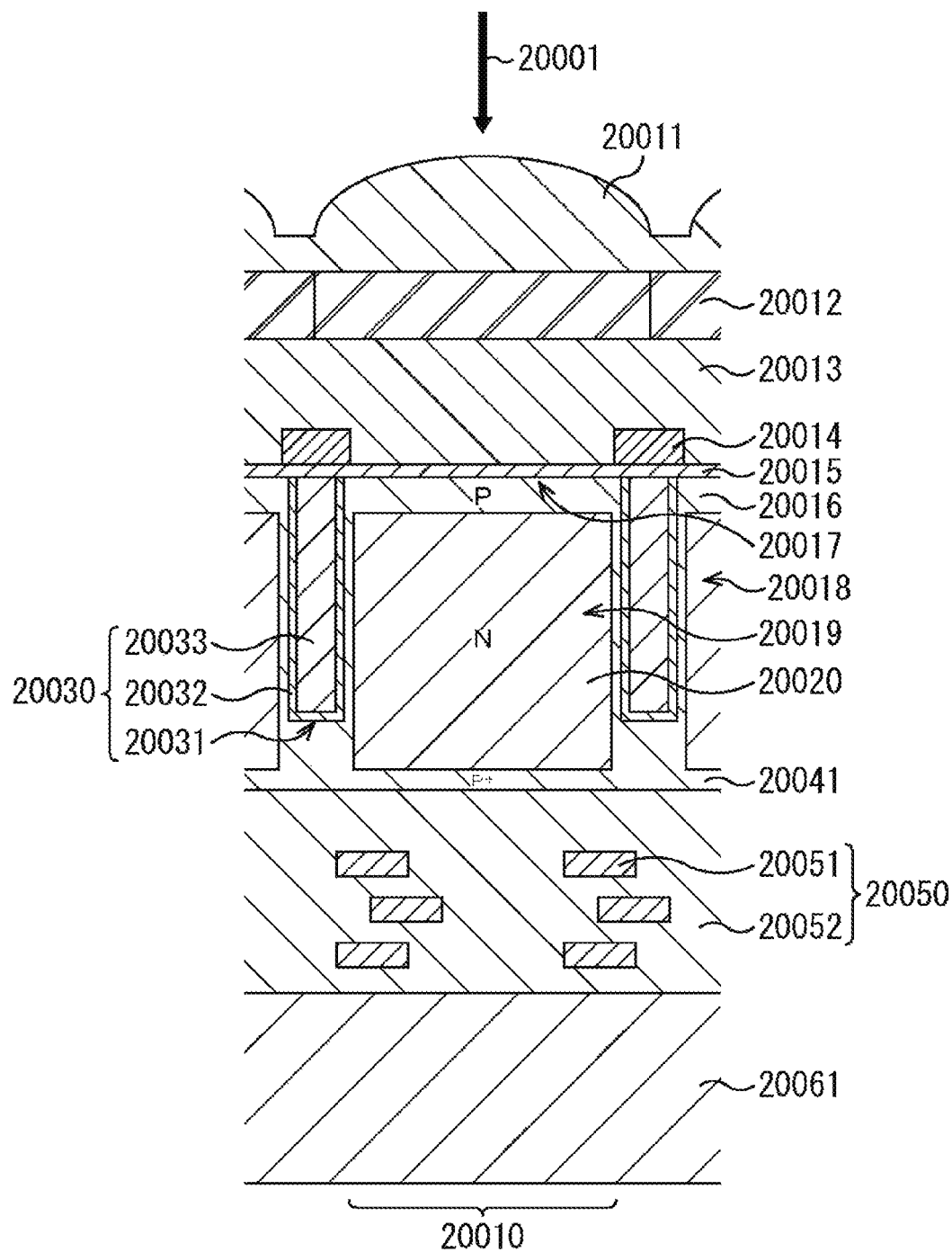
FIG. 15 is a cross-sectional view of a configuration example of a solid-state imaging apparatus to which a technology according to the present disclosure is applicable.

FIG. 15 is a cross-sectional view of a configuration example of a solid-state imaging apparatus to which a technology according to the present disclosure is applicable.

In the solid-state imaging apparatus, a PD (photodiode) 20019 constituting a pixel 20010 receives incident light 20001 which is incident from the rear surface (the upper surface in FIG. 15) side of a semiconductor substrate 20018. A flattened film 20013, a CF (color filter) 20012, and a microlens 20011 are provide above the PD 20019. In the PD 20019, the incident light 20001 having passed through these sections sequentially is received at a light receiving surface 20017 such that photoelectric conversion is performed on the light.

For example, the PD 20019 is formed as a charge storage region in which an n-type semiconductor region 20020 stores charges (electrons). In the PD 20019, the n-type semiconductor region 20020 is disposed inside p-type semiconductor regions 20016 and 20041 of the semiconductor substrate 20018. The p-type semiconductor region 20041 having impurity concentration higher than that on a side, of the n-type semiconductor region 20020, closer to the rear surface (upper surface) of the semiconductor substrate 20018 is disposed on a side, of the n-type semiconductor region 20020, closer to the front surface (lower surface). That is, the PD 20019 has a HAD (Hole-Accumulation Diode) structure, and the p-type semiconductor regions 20016 and 20041 are formed such that occurrence of a dark current is suppressed at each of a boundary with respect to the upper surface side of the n-type semiconductor region 20020 and a boundary with respect to the lower surface side.

A pixel separation part 20030 that electrically separates a plurality of the pixels 20010 from one another is disposed inside the semiconductor substrate 20018. In a region defined by the pixel separation part 20030, the PD 20019 is disposed. When the solid-state imaging apparatus is viewed from the upper surface side in FIG. 15, the pixel separation part 20030 is formed into, for example, a lattice-like shape so as to be interposed between the plurality of pixels 20010. The PD 20019 is formed in a region defined by the pixel separation part 20030.

An anode of each PD 20019 is grounded. In the solid-state imaging apparatus, signal charges (e.g., electrons) stored in the PD 20019 are read out through a transfer Tr (MOS FET) or the like (not depicted), and are outputted as electric signals to a VSL (vertical signal line) (not depicted).

A wiring layer 20050 is disposed on a front surface (lower surface), of the semiconductor substrate 20018, opposite to the rear surface (upper surface) on which the sections such as a light shielding film 20014, the CF 20012, and the microlens 20011 are disposed.

The wiring layer 20050 includes wirings 20051 and an insulating layer 20052, and is formed such that, in the insulating layer 20052, the wirings 20051 are electrically connected to elements. The wiring layer 20050 is what is called a multilayer wiring layer, and is formed by alternately layering a plurality of interlayer insulating films, which constitute the insulating layer 20052, and a plurality of the wirings 20051. Here, as the wirings 20051, a wiring to a Tr, such as the transfer Tr, for reading out charges from the PD 20019, and a wiring to the VSL or the like are layered through the insulating layer 20052.

A support substrate 20061 is disposed on a surface, of the wiring layer 20050, opposite to the side on which the PD 20019 is disposed. For example, a substrate formed of a silicon semiconductor having a thickness of several hundred micrometers is disposed as the support substrate 20061.

The light shielding film 20014 is disposed on the rear surface (the upper surface in FIG. 15) side of the semiconductor substrate 20018.

The light shielding film 20014 is formed so as to partially shield the incident light 20001 traveling from the upper side of the semiconductor substrate 20018 toward the lower side of the semiconductor substrate 20018.

The light shielding film 20014 is disposed above the pixel separation part 20030 that is disposed inside the semiconductor substrate 20018. Here, the light shielding film 20014 is disposed so as to be projected from the rear surface (upper surface) of the semiconductor substrate 20018 into a projection shape through the insulating film 20015, which is a silicon oxide film or the like. In contrast, no light shielding film 20014 is disposed but the upper side of the PD 20019 that is disposed inside the semiconductor substrate 20018 is opened in order to allow the incident light 20001 to be incident on the PD 20019.

That is, in a case where the solid-state imaging apparatus is viewed from the upper surface side in FIG. 15, the plane shape of the light shielding film 20014 is a lattice-like shape, and an opening for allowing the incident light 20001 to pass to the light receiving surface 20017 is formed.

The light shielding film 20014 is formed from light-shielding materials for shielding light. The light shielding film 20014 is formed by sequentially layering a titanium (Ti) film and a tungsten (W) film, for example. Alternatively, the light shielding film 20014 may be formed by sequentially layering a titanium nitride (TiN) film and a tungsten (W) film. Also, the light shielding film 20014 may be coated with nitride (N), etc.

The light shielding film 20014 is coated with the flattened film 20013. The flattened film 20013 is formed using an insulating material that allows light to pass therethrough.

The pixel separation part 20030 includes a groove portion 20031, a charge-fixed film 20032, and an insulating film 20033.

The charge-fixed film 20032 is formed, at the rear surface (upper surface) side of the semiconductor substrate 20018 so as to coat the groove portion 20031 that serves as a partition between a plurality of the pixels 20010.

Specifically, the charge-fixed film 20032 is disposed so as to have a fixed thickness to coat an inner surface of the groove portion 20031 formed on the rear surface (upper surface) side of the semiconductor substrate 20018. The insulating film 20033 is disposed so as to be embedded in (fills) the interior of the groove portion 20031 coated with the charge-fixed film 20032.

Here, the charge-fixed film 20032 is formed by using a high dielectric material having a fixed negative charge such that a positive-charge (hole) storage region is formed at the boundary with respect to the semiconductor substrate 20018 so as to suppress occurrence of a dark current. Since the charge-fixed film 20032 is formed so as to have a fixed negative charge, the fixed negative charge applies an electric field to an interface with respect to the semiconductor substrate 20018 so that a positive charge (hole) storage region is formed.

The charge-fixed film 20032 can be formed of a hafnium oxide film (HfO2 film), for example. Also, the charge-fixed film 20032 may be formed by additionally containing an oxide of at least one of hafnium, zirconium, aluminum, tantalum, titanium, magnesium, yttrium, or lanthanoid elements, for example.

A technology according to the present disclosure is applicable to a solid-state imaging apparatus such as that described so far.

<8. Cross-Sectional Configuration Example of Pixel Separation Part of Solid-State Imaging Apparatus to which Technology According to Present Disclosure is Applicable>

Figure 16:
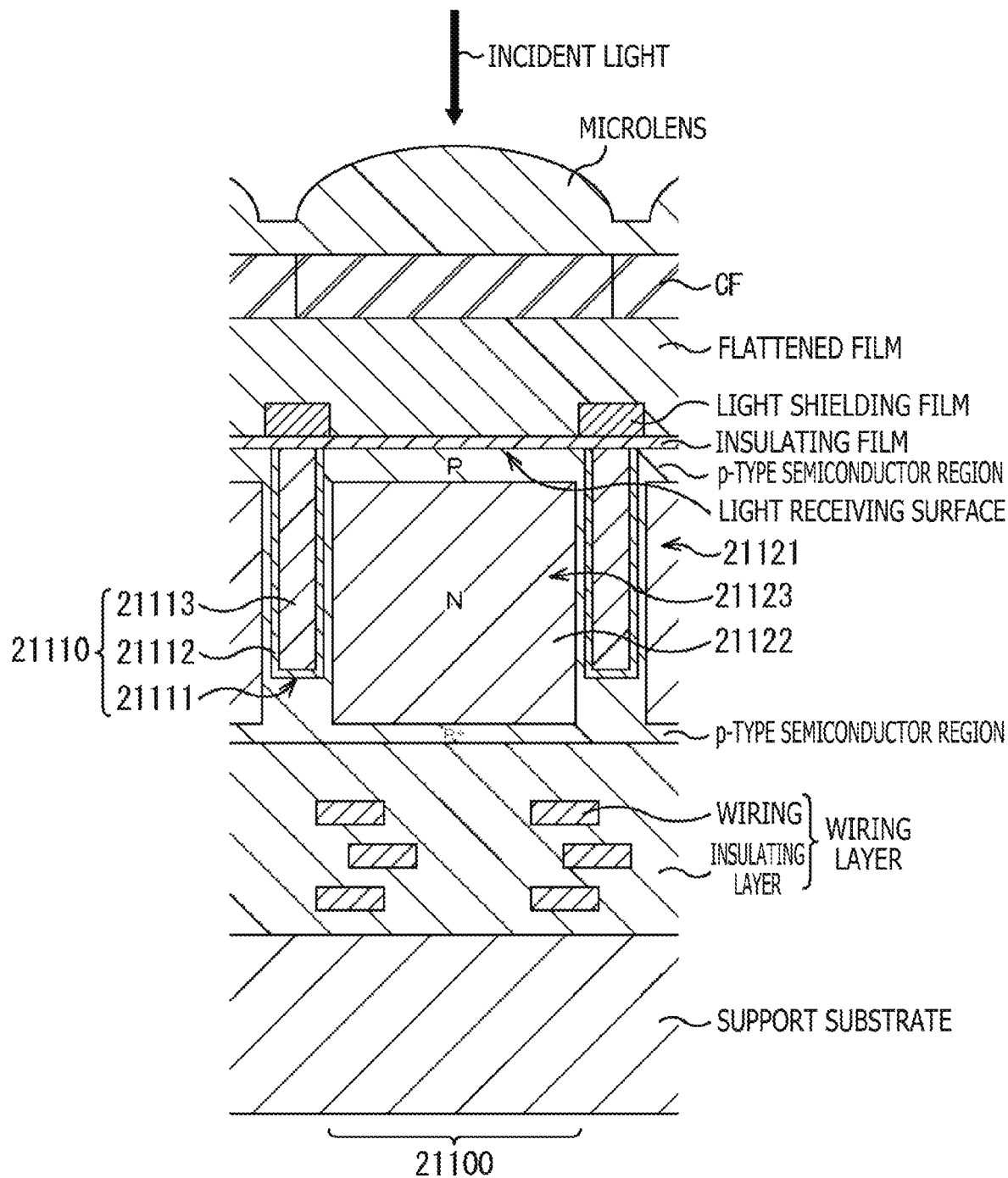
FIG. 16 is a cross-sectional view of a first configuration example of a pixel separation part of a solid-state imaging apparatus to which a technology according to the present disclosure is applicable.

FIG. 16 is a cross-sectional view of a first configuration example of a pixel separation part of a solid-state imaging apparatus to which a technology according to the present disclosure is applicable.

In the solid-state imaging apparatus, a pixel separation part 21110 is formed from an insulating material to serve as a partition between a plurality of pixels 21100. The pixel separation part 21110 electrically separates the plurality of pixels 21100 from one another.

The pixel separation part 21110 includes a groove portion 21111, a charge-fixed film 21112, and an insulating film 21113, and is formed, at the rear surface (upper surface in FIG. 16) side of a semiconductor substrate 21121, so as to be embedded in the semiconductor substrate 21121.

That is, on the rear surface (upper surface) side of the semiconductor substrate 21121, the groove portion 21111 is formed so as to define a boundary of an n-type semiconductor region 21122 constituting a charge storage region of a PD (photodiode) 20123. The inside of the groove portion 21111 is coated with the charge-fixed film 21112, and further, the groove portion 21111 is filled with the insulating film 21113, whereby the pixel separation part 21110 is formed.

When the solid-state imaging apparatus is viewed from the upper surface side in FIG. 16, the plane shape of the pixel separation part 21110 is a lattice-like shape, and the pixel separation part 21110 is interposed between the plurality of pixels 21100. The PD 20123 is formed in a rectangular region defined by the lattice-like pixel separation part 21110.

For example, a silicon oxide film (SiO), a silicon nitride film (SiN), or the like can be used as the insulating film 21113 of the pixel separation part 21110. The pixel separation part 21110 may be formed by shallow trench isolation, for example.

Figure 17:
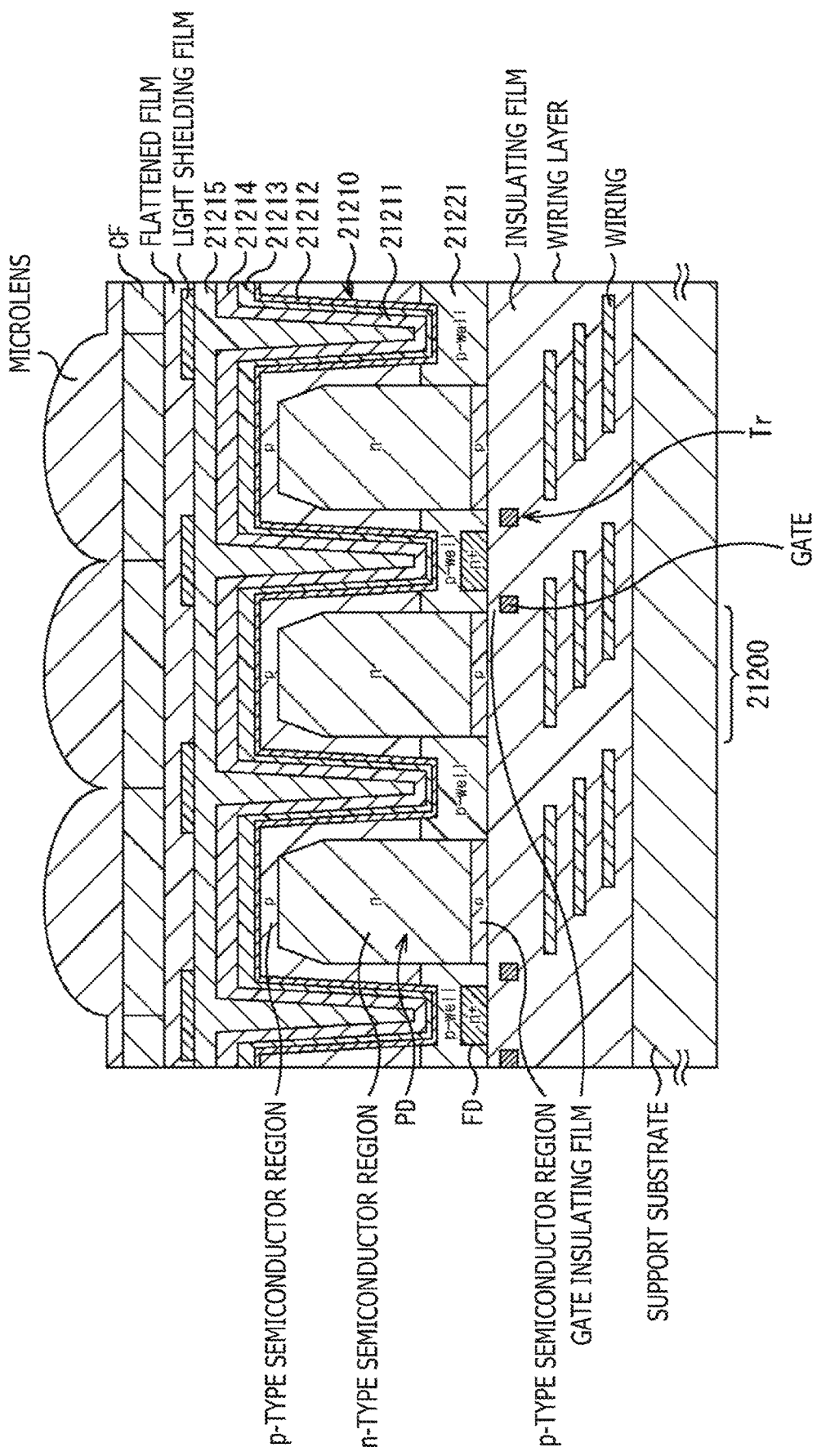
FIG. 17 is a cross-sectional view of a second configuration example of a pixel separation part of a solid-state imaging apparatus to which a technology according to the present disclosure is applicable.

FIG. 17 is a cross-sectional view of a second configuration example of a pixel separation part of a solid-state imaging apparatus to which a technology according to the present disclosure is applicable.

In FIG. 17, a pixel separation part 21210 serving as a partition between pixels 21200 is formed by embedding a first charge-fixed film 21212, a second charge-fixed film 21213, a first insulating film 21214, and a second insulating film 21215 in this order in a groove portion 21211. The groove portion 21211 is formed so as to have a tapered cross section the opening diameter of which is decreased toward the depth direction of a substrate 21221.

It is to be noted that the pixel separation part 21210 may be formed by embedding the first charge-fixed film 21212, the second charge-fixed film 21213, the first insulating film 21214, and the second insulating film 21215 in another order in the groove portion 21211. For example, the pixel separation part 21210 may be formed by embedding, in the groove portion 21211, the first insulating film 21214, the first charge-fixed film 21212, the second insulating film 21215, and the second charge-fixed film 21213 in this order to alternately embedding insulating films and charge-fixed films.

Figure 18:
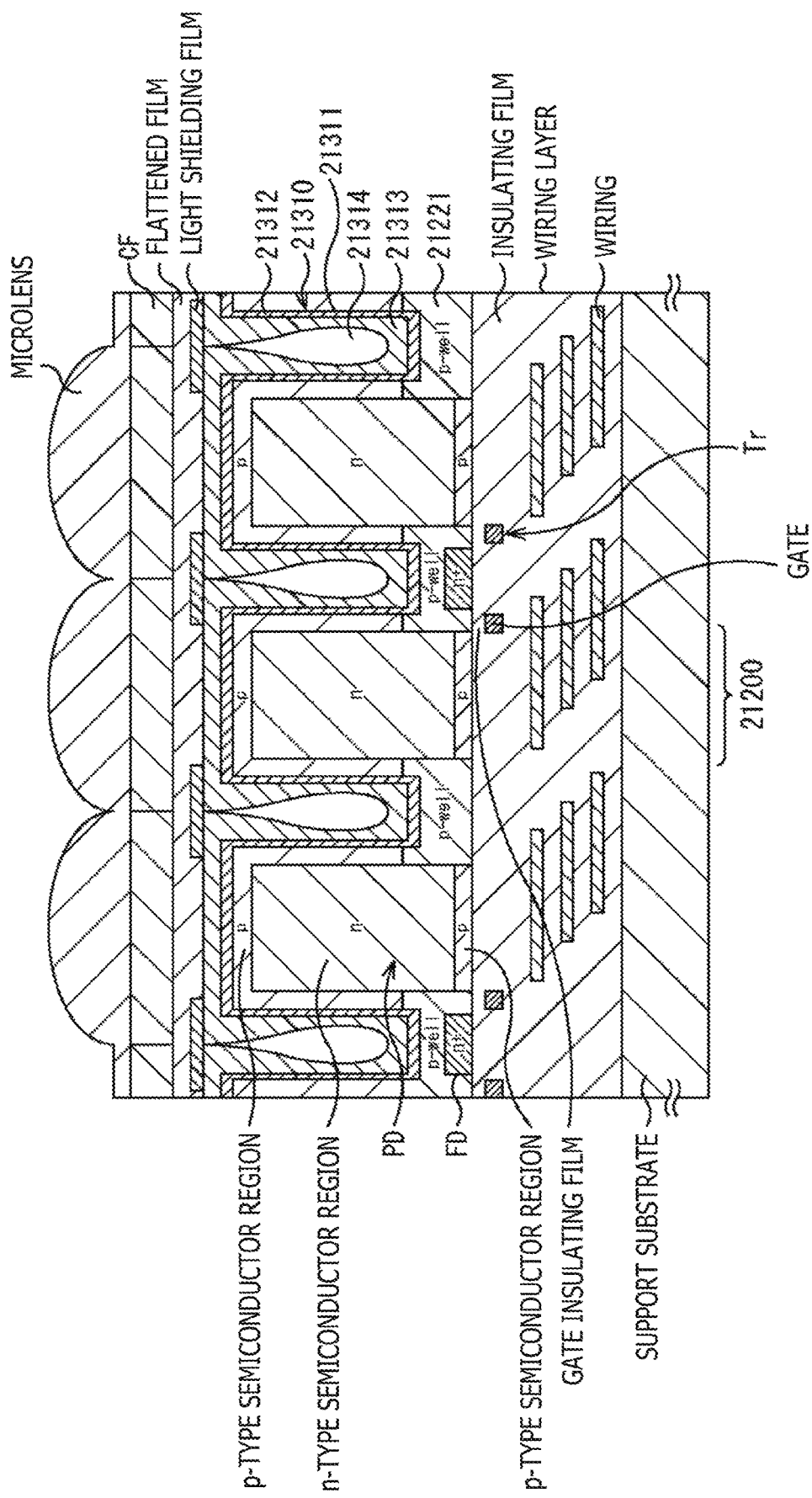
FIG. 18 is a cross-sectional view of a third configuration example of a pixel separation part of a solid-state imaging apparatus to which a technology according to the present disclosure is applicable.

FIG. 18 is a cross-sectional view of a third configuration example of a pixel separation part of a solid-state imaging apparatus to which a technology according to the present disclosure is applicable.

The solid-state imaging apparatus in FIG. 18 is different from the pixel separation part 21210 in FIG. 17 in that a pixel separation part 21310 serving as a partition between the pixels 21200 has a hollow structure in FIG. 18 whereas no hollow structure is provided in FIG. 17. In addition, the solid-state imaging apparatus in FIG. 18 is different from that in FIG. 17 in that a groove portion 21311 does not have a tapered shape but has a rectangular shape in FIG. 18 whereas the groove portion 21211 has a tapered shape in FIG. 17. It is to be noted that, like the groove portion 21211 in FIG. 17, the groove portion 21311 may be formed into a tapered shape.

The pixel separation part 21310 is formed by embedding a charge-fixed film 21312 and an insulating film 21313 in this order in the groove portion 21311 that is formed in the depth direction from the rear surface side (upper side) of the substrate 21221. A hollow section (i.e., a void) 21314 is formed inside the groove portion 21311.

That is, the charge-fixed film 21312 is formed on an inner wall surface of the groove portion 21311 and on the rear surface side of the substrate 21221, and the insulating film 21313 is formed so as to coat the charge-fixed film 21312. In addition, in order to form the hollow section 21314 in the groove portion 21311, the insulating film 21313 is formed so as to have such a film thickness that does not fill the entirety of the groove portion 21311 inside the groove portion 21311, and is formed so as to close the groove portion 21311 at the opening end of the groove portion 21311. The insulating film 21313 may be formed from a material such as silicon oxide, silicon nitride, silicon oxynitride, or resin, for example.

A technology according to the present disclosure is applicable to a solid-state imaging apparatus such as that described so far.

<9. Cross-Sectional Configuration Example of Solid-State Imaging Apparatus to which Technology According to Present Disclosure is Applicable and which has Pixels Each Obtained by Layering Photoelectric Conversion Sections>

Figure 19:
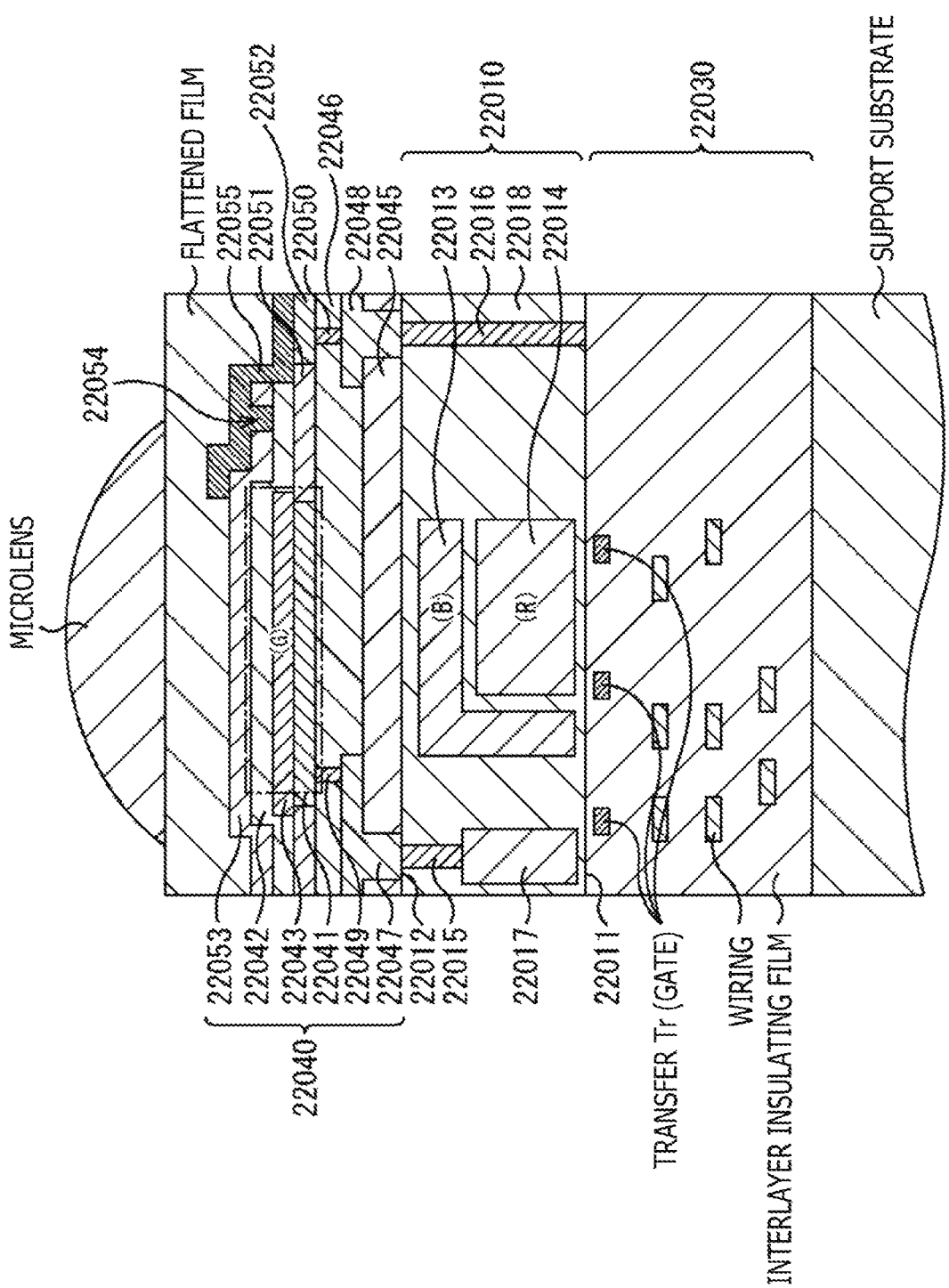
FIG. 19 is a cross-sectional view of a configuration example of a solid-state imaging apparatus to which a technology according to the present disclosure is applicable and which includes a pixel having layered photoelectric conversion sections.

FIG. 19 is a cross-sectional view of a configuration example of a solid-state imaging apparatus to which a technology according to the present disclosure is applicable and which has pixels each obtained by layering photoelectric conversion sections.

That is, FIG. 19 depicts a configuration example of one pixel of a solid-state imaging apparatus that has pixels each obtained by layering photoelectric conversion sections.

In the solid-state imaging apparatus, a multilayer wiring layer 22030 in which transfer Trs (MOS FET), etc., are formed is disposed on the side of a surface 22011 which is a front surface of a semiconductor substrate 22010.

In FIG. 19, the solid-state imaging apparatus has a layered structure in which one organic photoelectric conversion section 22040 and two inorganic photoelectric conversion sections 22013 and 22014 that selectively detect light having different wavelength bands and perform photoelectric conversion thereon are vertically layered. The organic photoelectric conversion section 22040 is formed by containing two or more organic semiconductor materials, for example.

Since the two inorganic photoelectric conversion sections 22013 and 22014 and the one organic photoelectric conversion section 22040 are layered as described above, red, green, and blue color signals can be acquired by one element (pixel). The organic photoelectric conversion section 22040 is formed on a surface 22012 which is the rear surface of the semiconductor substrate 22010. The inorganic photoelectric conversion sections 22013 and 22014 are formed so as to be embedded in the semiconductor substrate 22010.

The organic photoelectric conversion section 22040 is formed of an organic photoelectric conversion element that absorbs light in a selective wavelength band, that is, green light here by using an organic semiconductor, thereby generates an electron-and-positive hole pair. The organic photoelectric conversion section 22040 has a structure in which an organic photoelectric conversion layer (organic semiconductor layer) 22043 is sandwiched between a lower electrode 22041 and an upper electrode 22042 for extracting signal charges. The lower electrode 22041 and the upper electrode 22042 are electrically connected, through a wiring layer and a contact metal layer, to conductive plugs 22015 and 22016 that are embedded in the semiconductor substrate 22010.

In the organic photoelectric conversion section 22040, interlayer insulating films 22045 and 22046 are formed on the surface 22012 of the semiconductor substrate 22010. In the interlayer insulating film 22045, through holes are provided in regions respectively opposed to the conductive plugs 22015 and 22016, and conductive plugs 22047 and 22048 are embedded in the respective through holes. In the interlayer insulating film 22046, wiring layers 22049 and 22050 are embedded in regions respectively opposed to the conductive plugs 22047 and 22048. On the interlayer insulating film 22046, the lower electrode 22041 is disposed, and a wiring layer 22052 that is electrically separated from the lower electrode 22041 and the insulating film 22051 is disposed. The organic photoelectric conversion layer 22043 is formed on the lower electrode 22041, among the lower electrode 22041, the insulating film 22051, and the wiring layer 22052. The upper electrode 22042 is formed so as to cover the organic photoelectric conversion layer 22043. A protective film 22053 is formed on the upper electrode 22042 so as to cover a surface of the upper electrode 22042. A contact hole 22054 is disposed in a predetermined region of the protective film 22053. A contact metal layer 22055 that fills the contact hole 22054 and that extends to the upper surface of the wiring layer 22052, is formed on the protective film 22053.

The conductive plug 22047 functions as a connector together with the conductive plug 22015, and forms, together with the conductive plug 22015 and the wiring layer 22049, a charge (electron) transmission path from the lower electrode 22041 to a green power storage layer 22017. The conductive plug 22048 functions as a connector together with the conductive plug 22016, and forms, together with the conductive plug 22016, the wiring layer 22050, the wiring layer 22052, and the contact metal layer 22055, a charge (positive hole) discharge path from the upper electrode 22042. In order to also function as light shielding films, the conductive plugs 22047 and 22048 may be formed from a laminate film including metallic materials such as titanium (Ti), titanium nitride (TiN), and tungsten (W), for example. In addition, since such a laminate film is used, contact to silicon can be ensured even in the case where each of the conductive plugs 22015 and 22016 is formed from an n-type or p-type semiconductor layer.

In order to lower the interface state with respect to a silicon layer 22018 of the semiconductor substrate 22010 and to suppress occurrence of a dark current from the interface with respect to the silicon layer 22018, the interlayer insulating film 22045 may be formed of an insulating film having a small interface state. As this insulating film, a laminate film including a hafnium oxide (HfO2) film and a silicon oxide (SiO2) film can be used, for example. The interlayer insulating film 22046 may be formed of a single layer film made from one of silicon oxide, silicon nitride (SiN), silicon oxynitride (SiON), etc., or a laminate film including two or more of silicon oxide, silicon nitride, silicon oxynitride, etc.

The insulating film 22051 is formed of a single layer film made from one of silicon oxide, silicon nitride, silicon oxynitride, etc., or a laminate film including two or more of silicon oxide, silicon nitride, silicon oxynitride, etc. For example, a surface of the insulating film 22051 is flattened, and has a shape and a pattern substantially level with the lower electrode 22041. The insulating film 22051 has a function of electrically separating the lower electrodes 22041 of respective pixels from one another in the solid-state imaging apparatus.

The lower electrode 22041 is formed in a region to face the inorganic photoelectric conversion sections 22013 and 22014 that are formed side by side in the vertical direction (the up-down direction in FIG. 19) in the semiconductor substrate 22010, and to cover the inorganic photoelectric conversion sections 22013 and 22014. The lower electrode 22041 is formed of a conductive film having light transmissivity, and is formed from indium tin oxide (ITO), for example. Besides indium tin oxide, a tin oxide (SnO2)-based material which is doped with a dopant, or a zinc oxide (ZnO)-based material obtained by doping aluminum-zinc oxide with a dopant, may be used as the material of the lower electrode 22041. Examples of the zinc oxide-based material include aluminum-zinc oxide (AZO) which is doped with aluminum (Al) as a dopant, gallium-zinc oxide (GZO) which is doped with gallium (Ga), and indium-zinc oxide (IZO) which is doped with indium (In). Further, CuI, InSbO4, ZnMgO, CuInO2, MgIN2O4, CdO, ZnSnO3, or the like may be used. It is to be noted that, in FIG. 19, since the signal charges (electrons) obtained at the organic photoelectric conversion layer 22043 are extracted from the lower electrode 22041, the lower electrode 22041 is separately formed in each pixel.

The organic photoelectric conversion layer 22043 is formed by containing three material types: a first organic semiconductor material; a second organic semiconductor material; and/or a third organic semiconductor material, for example. The three types of organic semiconductor materials include a p-type organic semiconductor and/or an n-type organic semiconductor, and further, perform photoelectric conversion of light in a selective wavelength band, and allow light in another wavelength band to pass therethrough. Specifically, the organic photoelectric conversion layer 22043 has a maximum absorption wavelength ranging from 450 to 650 nm, which is the green wavelength, for example.

Other layers (not depicted) may be disposed between the organic photoelectric conversion layer 22043 and the lower electrode 22041, and between the organic photoelectric conversion layer 22043 and the upper electrode 22042. For example, an undercoat film, a positive hole transport layer, an electronic blocking film, the organic photoelectric conversion layer 22043, a positive hole blocking film, a buffer film, an electron transport layer, and a work function adjusting film may be layered in this order from the lower electrode 22041 side.

The upper electrode 22042 is formed of a conductive film having light transmissivity similar to that of the lower electrode 22041. The upper electrodes 22042 in respective pixels may be separated from one another, or the upper electrode 22042 may be formed as a common electrode among the pixels. The thickness of the upper electrode 22042 is 10 to 200 nm, for example.

The protective film 22053 is made from a material having light transmissivity, and is a single layer film made from any one of silicon oxide, silicon nitride, and silicon oxynitride, or is a laminate film made from two or more of silicon oxide, silicon nitride, and silicon oxynitride, for example. The thickness of the protective film 22053 is 100 to 30000 nm, for example.

For example, the contact metal layer 22055 is made from any one of titanium, tungsten, titanium nitride, aluminum, etc., or is formed of a laminate film including two or more of titanium, tungsten, titanium nitride, aluminum, etc.

Each of the inorganic photoelectric conversion sections 22013 and 22014 is a PD (photodiode) having a pn junction. On an optical path in the semiconductor substrate 22010, the inorganic photoelectric conversion sections 22013 and 22014 are formed in this order from the surface 22012 side. The inorganic photoelectric conversion section 22013 selectively detects blue light, and stores a signal charge corresponding to the blue color. The inorganic photoelectric conversion section 22013 is formed so as to extend from a selective region along the surface 22012 of the semiconductor substrate 22010 to a region near the interface with respect to the multilayer wiring layer 22030, for example. The inorganic photoelectric conversion section 22014 selectively detects red light, and stores a signal charge corresponding to the red color. The inorganic photoelectric conversion section 22014 is formed across a region below (on the surface 22011 side of) the inorganic photoelectric conversion section 22013, for example. It is to be noted that Blue is a color corresponding to the wavelength band of 450 to 495 nm, for example, and Red is a color corresponding to the wavelength band of 620 to 750 nm. It is sufficient that the inorganic photoelectric conversion sections 22013 and 22014 can each detect light having a part or the whole of the corresponding wavelength band.

The pixel in FIG. 19 has a layered structure in which the organic photoelectric conversion section 22040 and the two inorganic photoelectric conversion sections 22013 and 22014 are vertically layered. The organic photoelectric conversion section 22040, the inorganic photoelectric conversion section 22013, and the inorganic photoelectric conversion section 22014 absorb (detect) green light, blue light, and red light, respectively, and each perform photoelectric conversion on the light. Accordingly, in one pixel, vertical spectroscopy is performed in a vertical (layer) direction so that red, green, and blue signals can be acquired.

A technology according to the present disclosure is applicable to the aforementioned solid-state imaging apparatuses.

<10. Configuration Example of Laminate-Type Solid-State Imaging Apparatus to which Technology According to Present Disclosure is Applicable>

Figure 20A:
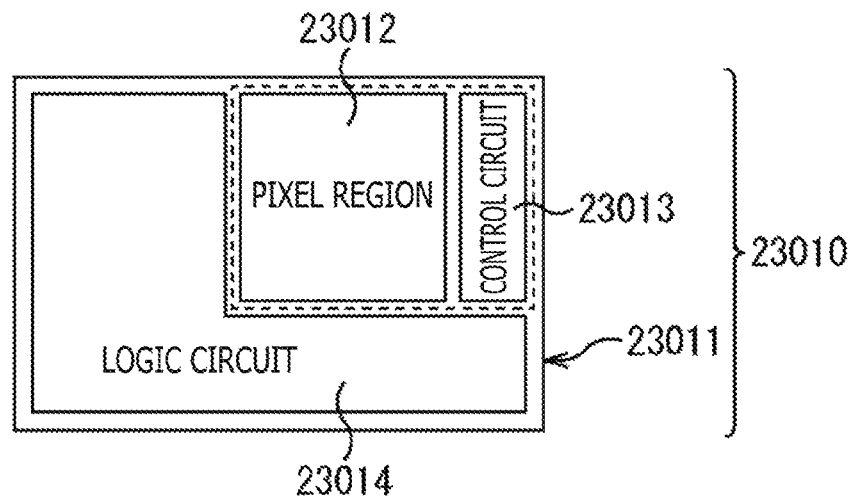
FIGS. 20A, 20B, and 20C are diagrams depicting an outline of a configuration example of a laminate-type solid-state imaging apparatus to which a technology according to the present disclosure is applicable.
Figure 20B:
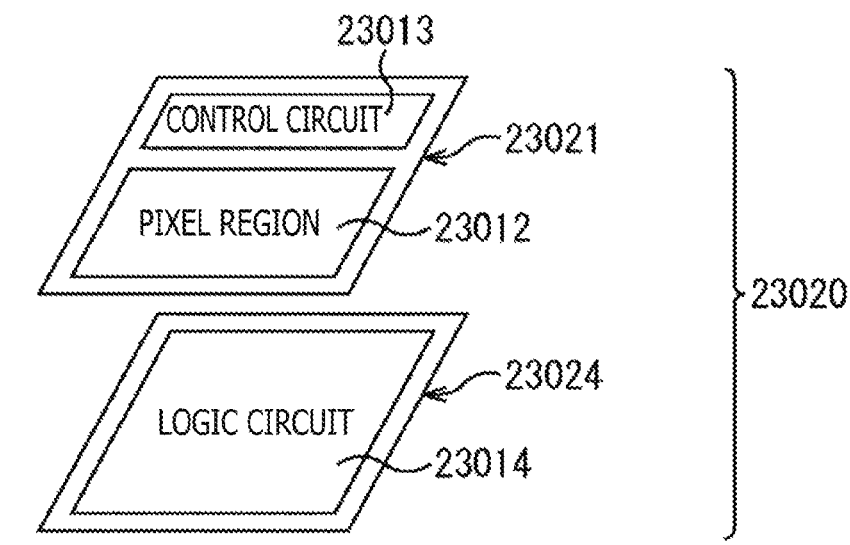
Figure 20C:
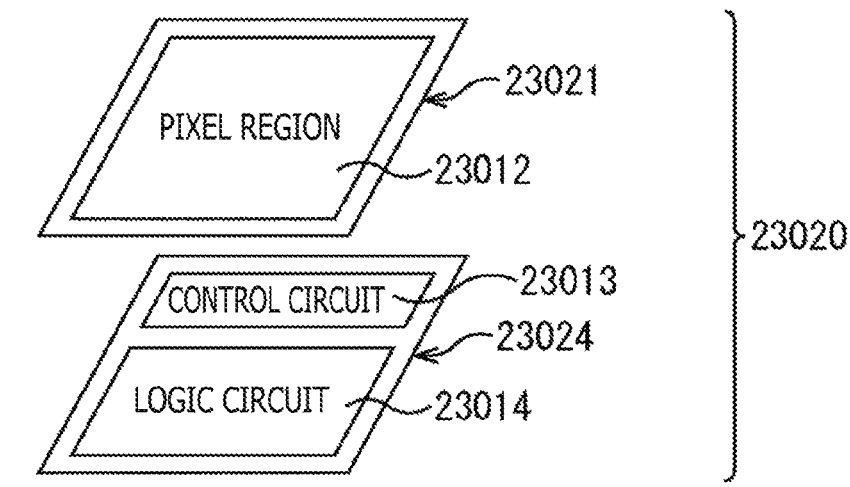

FIGS. 20A, 20B, and 20C are diagrams depicting an outline of a configuration example of a laminate-type solid-state imaging apparatus to which a technology according to the present disclosure is applicable.

FIG. 20A depicts a schematic configuration example of a non-laminate type solid-state imaging apparatus. A solid-state imaging apparatus 23010 has one die (semiconductor substrate) 23011, as depicted in FIG. 20A. A pixel region 23012 in which pixels are arranged into an array, a control circuit 23013 that drives the pixels and further performs various control, and a logic circuit 23014 for processing signals, are mounted on the die 23011.

FIGS. 20B and 20C each depict a schematic configuration example of a laminate-type solid-state imaging apparatus. A solid-state imaging apparatus 23020 is formed by layering two dies: a sensor die 23021 and a logic die 23024, and electrically connecting the two dies to each other to form one semiconductor chip, as depicted in FIGS. 20B and 20C.

In FIG. 20B, the pixel region 23012 and the control circuit 23013 are mounted on the sensor die 23021, and the logic circuit 23014 including a signal processing circuit for processing signals is mounted on the logic die 23024.

In FIG. 20C, the pixel region 23012 is mounted on the sensor die 23021, and the control circuit 23013 and the logic circuit 23014 are mounted on the logic die 23024.

Figure 21:
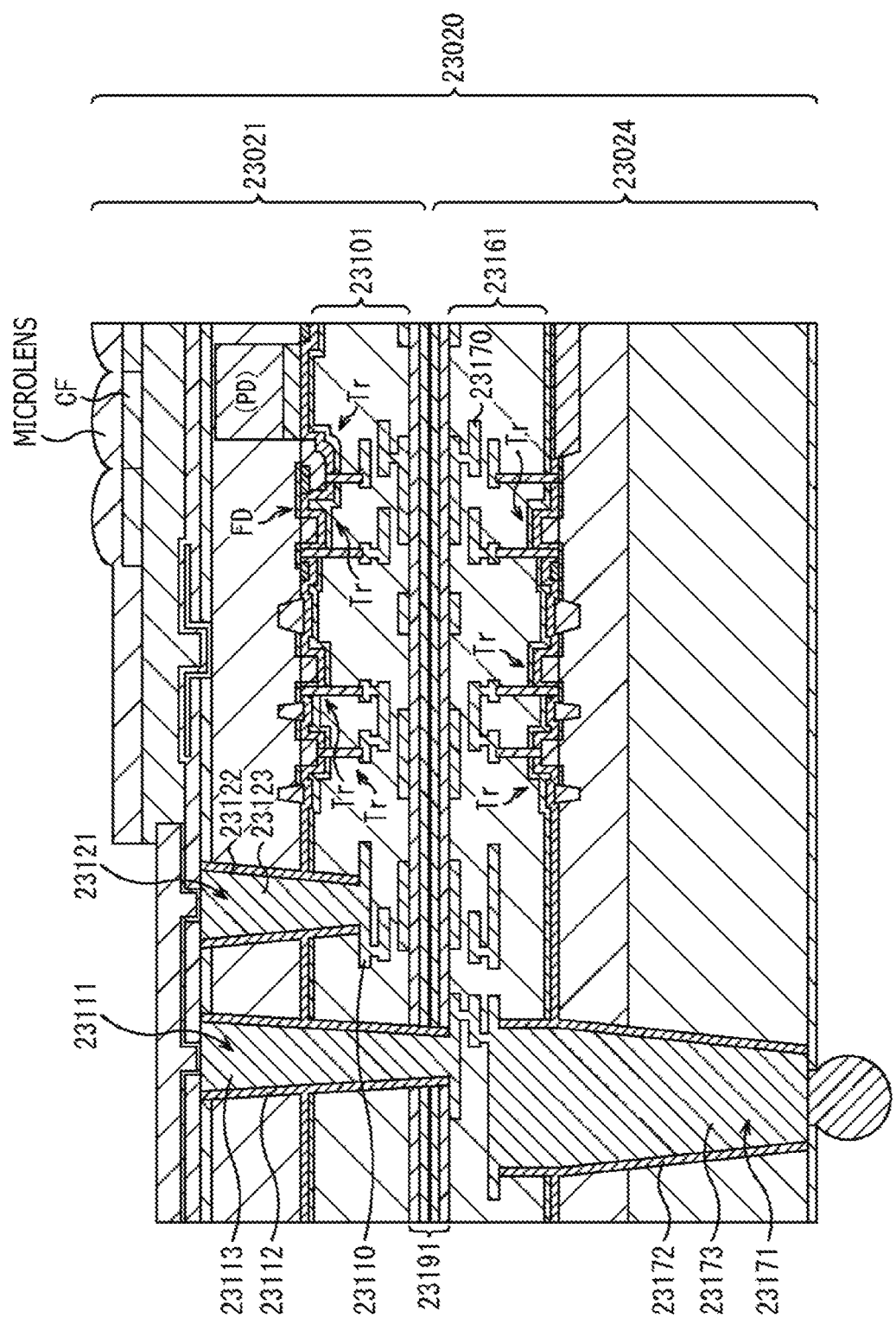
FIG. 21 is a cross-sectional view of a first configuration example of a laminate-type solid-state imaging apparatus 23020.

FIG. 21 is a cross-sectional view of a first configuration example of the laminate-type solid-state imaging apparatus 23020.

In the sensor die 23021, PDs (photodiodes), FDs (floating diffusion), and Trs (MOS FETs) constituting pixels forming the pixel region 23012, and Trs, etc., forming the control circuit 23013 are formed. Also, on the sensor die 23021, a wiring layer 23101 including plural layers, which are three wirings 23110 in this example, is formed. It is to be noted that (Trs forming) the control circuit 23013 may be formed not on the sensor die 23021 but on the logic die 23024.

On the logic die 23024, Trs constituting the logic circuit 23014 are formed. Also, on the logic die 23024, a wiring layer 23161 having plural layers, which are three wirings 23170 in this example, is formed. Further, a connection hole 23171 having an inner wall surface on which an insulating film 23172 is formed, is formed in the logic die 23024. A connection conductor 23173 which is connected to the wirings 23170 or the like is embedded in the connection hole 23171.

The sensor die 23021 and the logic die 23024 are bonded together such that the wiring layers 23101 and 23161 are opposed to each other. Accordingly, the laminate-type solid-state imaging apparatus 23020 in which the sensor die 23021 and the logic die 23024 are layered, is formed. A film 23191 such as a protective film is formed on a surface where the sensor die 23021 and the logic die 23024 are bonded together.

In the sensor die 23021, a connection hole 23111 is formed so as to extend from the rear surface side of the sensor die 23021 (a side on which light is incident on a PD) (the upper side) to the uppermost wiring 23170 of the logic die 23024 through the sensor die 23021. In addition, in the sensor die 23021, a connection hole 23121 that is close to the connection hole 23111 and extends from the rear surface side of the sensor die 23021 to the first wiring 23110 is formed. An insulating film 23112 is formed on an inner wall surface of the connection hole 23111, and an insulating film 23122 is formed on an inner wall surface of the connection hole 23121. Connection conductors 23113 and 23123 are formed embedded in the connection holes 23111 and 23121, respectively. The connection conductor 23113 and the connection conductor 23123 are electrically connected to each other on the rear surface side of the sensor die 23021. Accordingly, the sensor die 23021 and the logic die 23024 are electrically connected to each other through the wiring layer 23101, the connection hole 23121, the connection hole 23111, and the wiring layer 23161.

Figure 22:
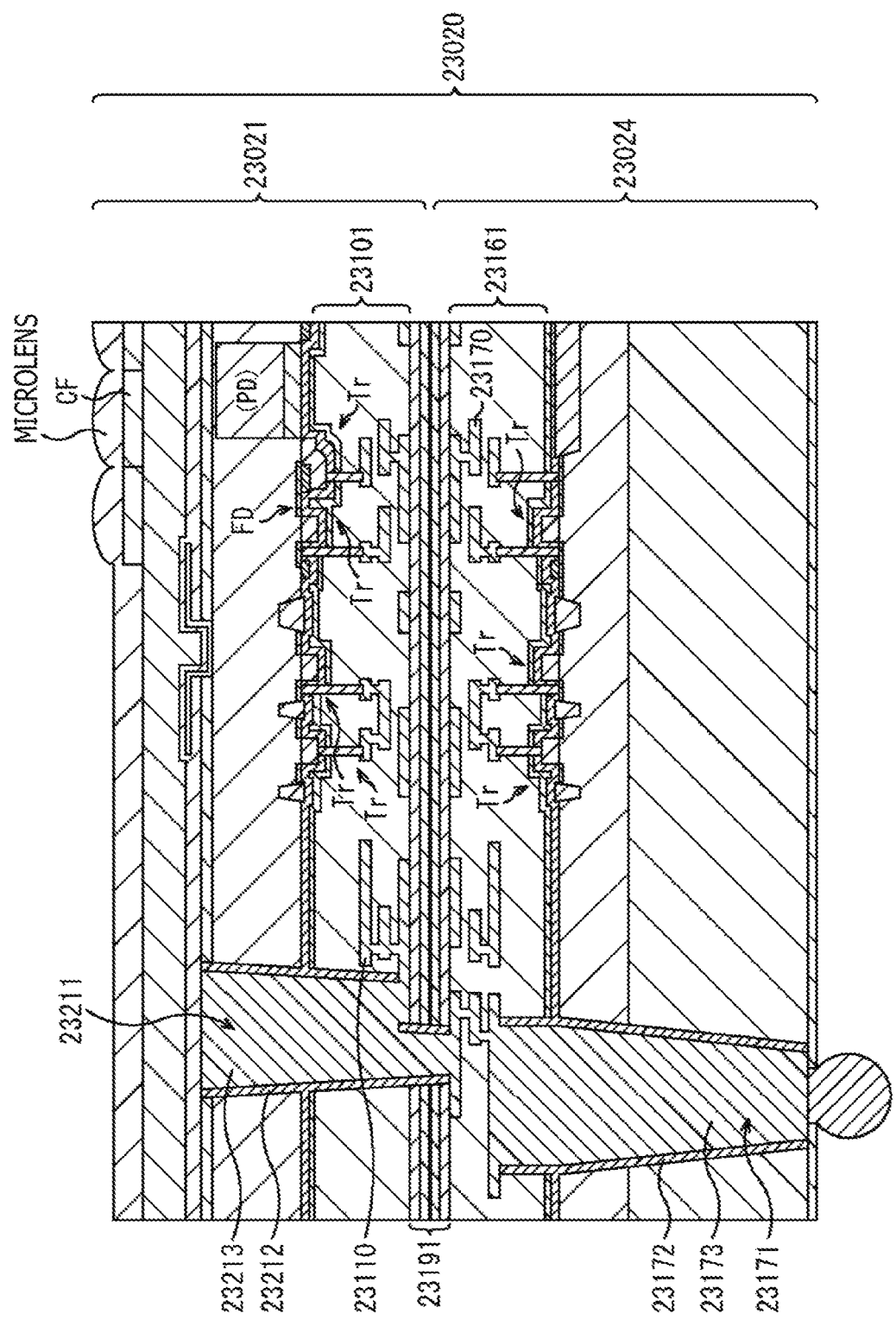
FIG. 22 is a cross-sectional view of a second configuration example of the laminate-type solid-state imaging apparatus 23020.

FIG. 22 is a cross-sectional view of a second configuration example of the laminate-type solid-state imaging apparatus 23020.

In the second configuration example of the solid-state imaging apparatus 23020, the ((wirings 23110) of the wiring layer 23101 of the) sensor die 23021 and the ((wirings 23170) of the wiring layer 23161 of the) logic die 23024 are electrically connected to each other by one connection hole 23211 formed in the sensor die 23021.

That is, in FIG. 22, the connection hole 23211 is formed so as to extend from the rear surface side of the sensor die 23021 to the uppermost wiring 23170 of the logic die 23024 through the sensor die 23021, and further, extends to the uppermost wiring 23110 of the sensor die 23021. An insulating film 23212 is formed on an inner wall surface of the connection hole 23211, and a connection conductor 23213 is embedded in the connection hole 23211. In FIG. 21 described above, the sensor die 23021 and the logic die 23024 are electrically connected to each other by the two connection holes 23111 and 23121. However, in FIG. 22, the sensor die 23021 and the logic die 23024 are electrically connected to each other by the one connection hole 23211.

Figure 23:
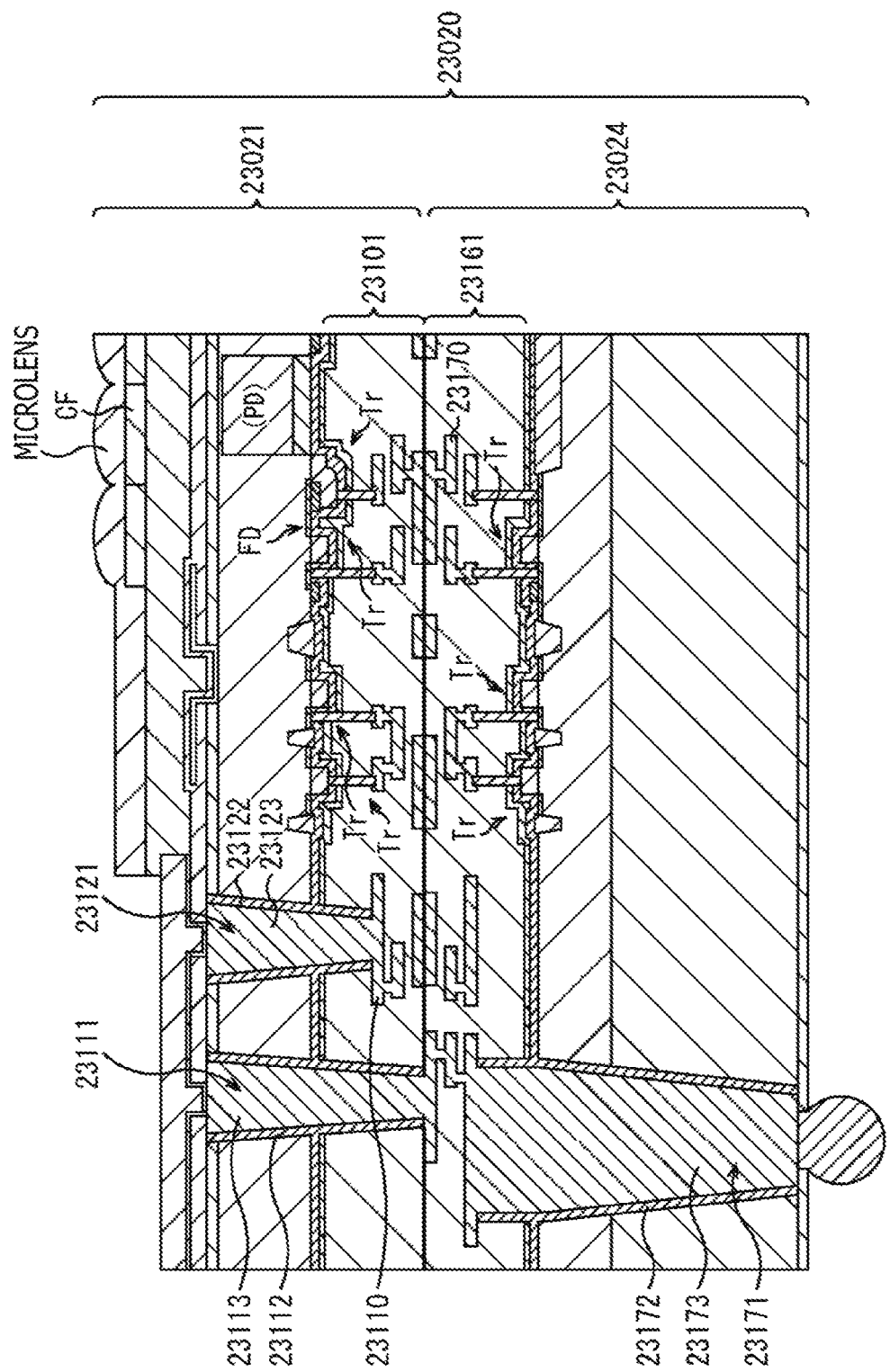
FIG. 23 is a cross-sectional view of a third configuration example of the laminate-type solid-state imaging apparatus 23020.

FIG. 23 is a cross-sectional view of a third configuration example of the laminate-type solid-state imaging apparatus 23020.

The solid-state imaging apparatus 23020 in FIG. 23 is different from that in FIG. 21 in that no film 23191 such as a protective film is formed on the surface where the sensor die 23021 and the logic die 23024 are bonded together in FIG. 23 whereas the film 23191 such as a protective film is formed on the surface where the sensor die 23021 and the logic die 23024 are bonded together in FIG. 21.

The solid-state imaging apparatus 23020 in FIG. 23 is formed by overlaying the sensor die 23021 on the logic die 23024 so as to bring the wirings 23110 and 23170 into direct contact with each other, and by performing heating thereon while applying a prescribed load so as to directly join the wirings 23110 and 23170 together.

Figure 24:
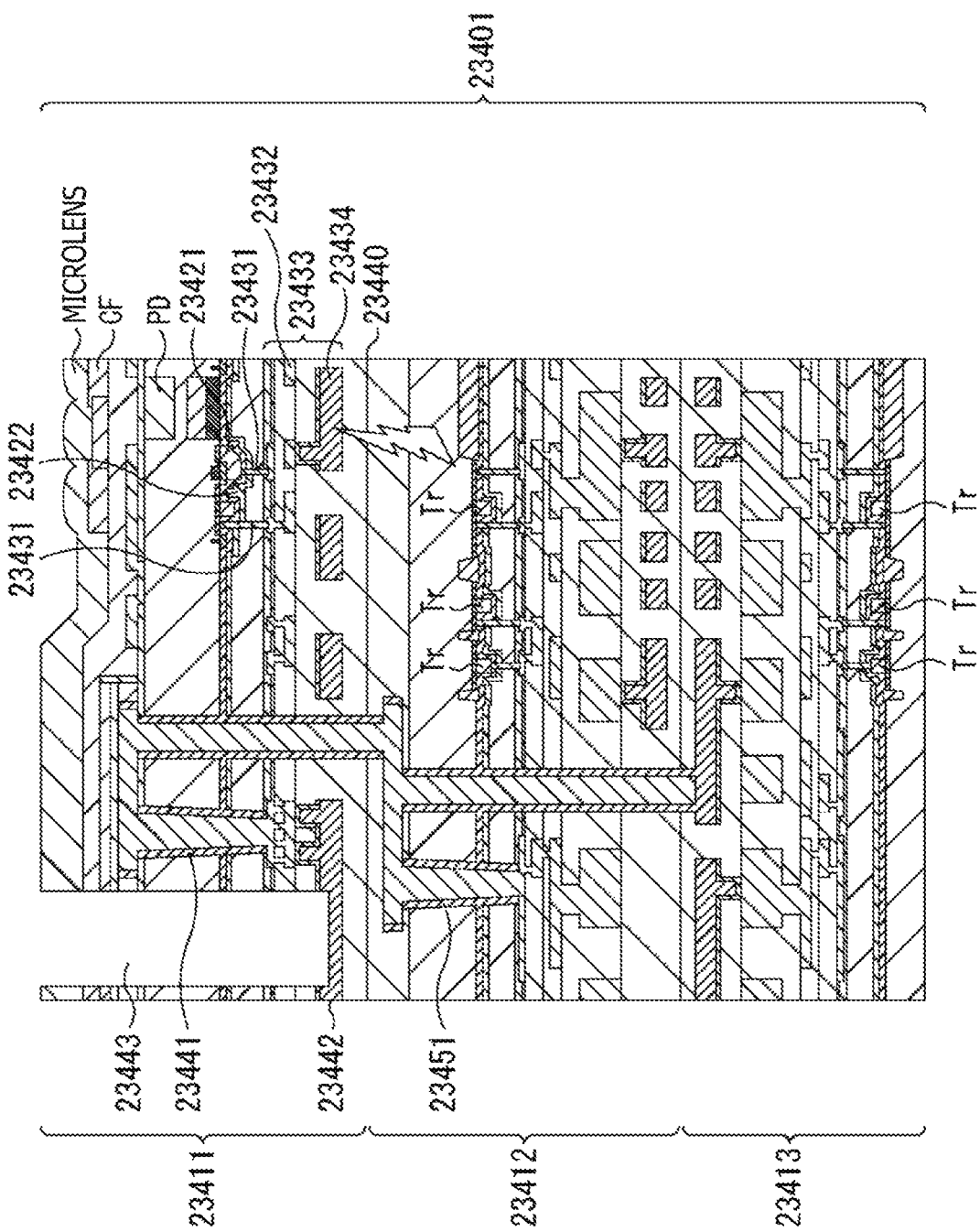
FIG. 24 is a cross-sectional view of another configuration example of a laminate-type solid-state imaging apparatus to which a technology according to the present disclosure is applicable.

FIG. 24 is a cross-sectional view of another configuration example of a laminate-type solid-state imaging apparatus to which a technology according to the present disclosure is applicable.

In FIG. 24, a solid-state imaging apparatus 23401 has a three-layer laminate structure in which three dies: a sensor die 23411, a logic die 23412, and a memory die 23413 are layered.

The memory die 23413 has a memory circuit for storing data which is temporarily required for signal processing to be performed in the logic die 23412, for example.

In FIG. 24, the logic die 23412 and the memory die 23413 are layered in this order below the sensor die 23411. However, the logic die 23412 and the memory die 23413 may be layered in the opposite order below the sensor die 23411, that is, the memory die 23413 and the logic die 23412 may be layered in this order.

It is to be noted that, in FIG. 24, a PD which serves as a photoelectric conversion section of a pixel and a source/drain region of a pixel Tr are formed on the sensor die 23411.

A gate electrode is formed around the PD with a gate insulating film interposed therebetween, and a pixel Tr 23421 or a pixel Tr 23422 is formed of the gate electrode and a pair of source/drain regions.

The pixel Tr 23421 adjacent to the PD is a transfer Tr, one of a pair of source/drain regions constituting the pixel Tr 23421 is an FD.

In addition, an interlayer insulating film is formed on the sensor die 23411, and connection holes are formed in the interlayer insulating film. Connection conductors 23431 which are connected to the pixel Tr 23421 and the pixel Tr 23422 are formed in the connection holes.

Moreover, on the sensor die 23411, a wiring layer 23433 having plural wirings 23432 which are respectively connected to the connection conductors 23431 is formed.

Also, an aluminum pad 23434 that serves as an electrode for external connection is formed on the lowermost layer of the wiring layer 23433 on the sensor die 23411. That is, on the sensor die 23411, the aluminum pad 23434 is formed at a position closer to a contact surface 23440 with respect to the logic die 23412 than the wirings 23432. The aluminum pad 23434 is used as one end of a wiring related to input/output of signals to/from the outside.

Moreover, a contact 23441 that is used for electrical connection to the logic die 23412 is formed on the sensor die 23411. The contact 23441 is connected to a contact 23451 on the logic die 23412, and is also connected to the aluminum pad 23442 on the sensor die 23411.

Further, on the sensor die 23411, a pad hole 23443 is formed so as to extend from the rear surface side (upper side) of the sensor die 23411 to the aluminum pad 23442.

A technology according to the present disclosure is applicable to solid-state imaging apparatuses such as those described so far.

<11. Configuration Example of Solid-State Imaging Apparatus to which Technology According to Present Disclosure is Applicable and which has Plurality of Sharing Pixels>

Figure 25:
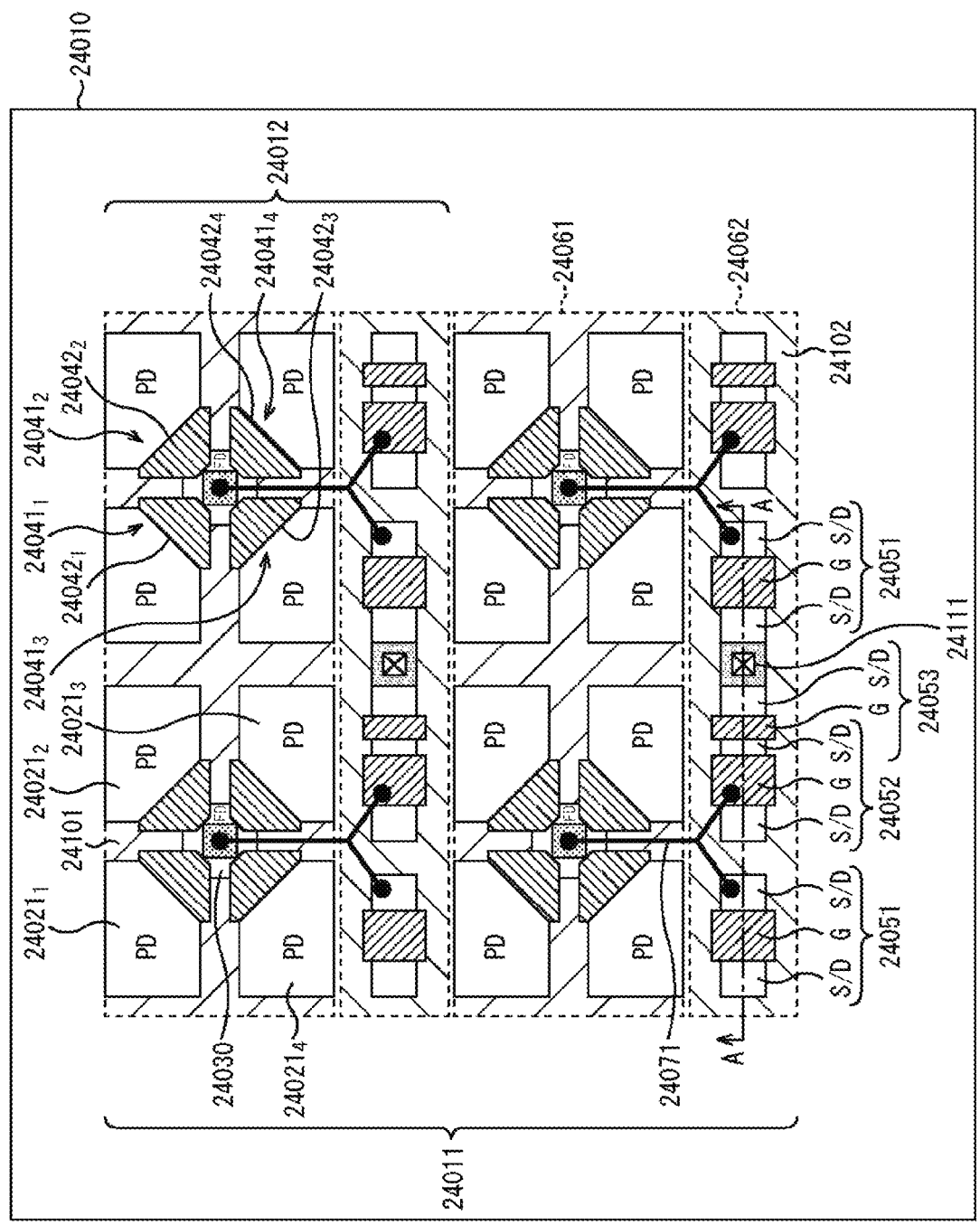
FIG. 25 is a plan view of a first configuration example of a solid-state imaging apparatus to which a technology according to the present disclosure is applicable and which has a plurality of sharing pixels.
Figure 26:
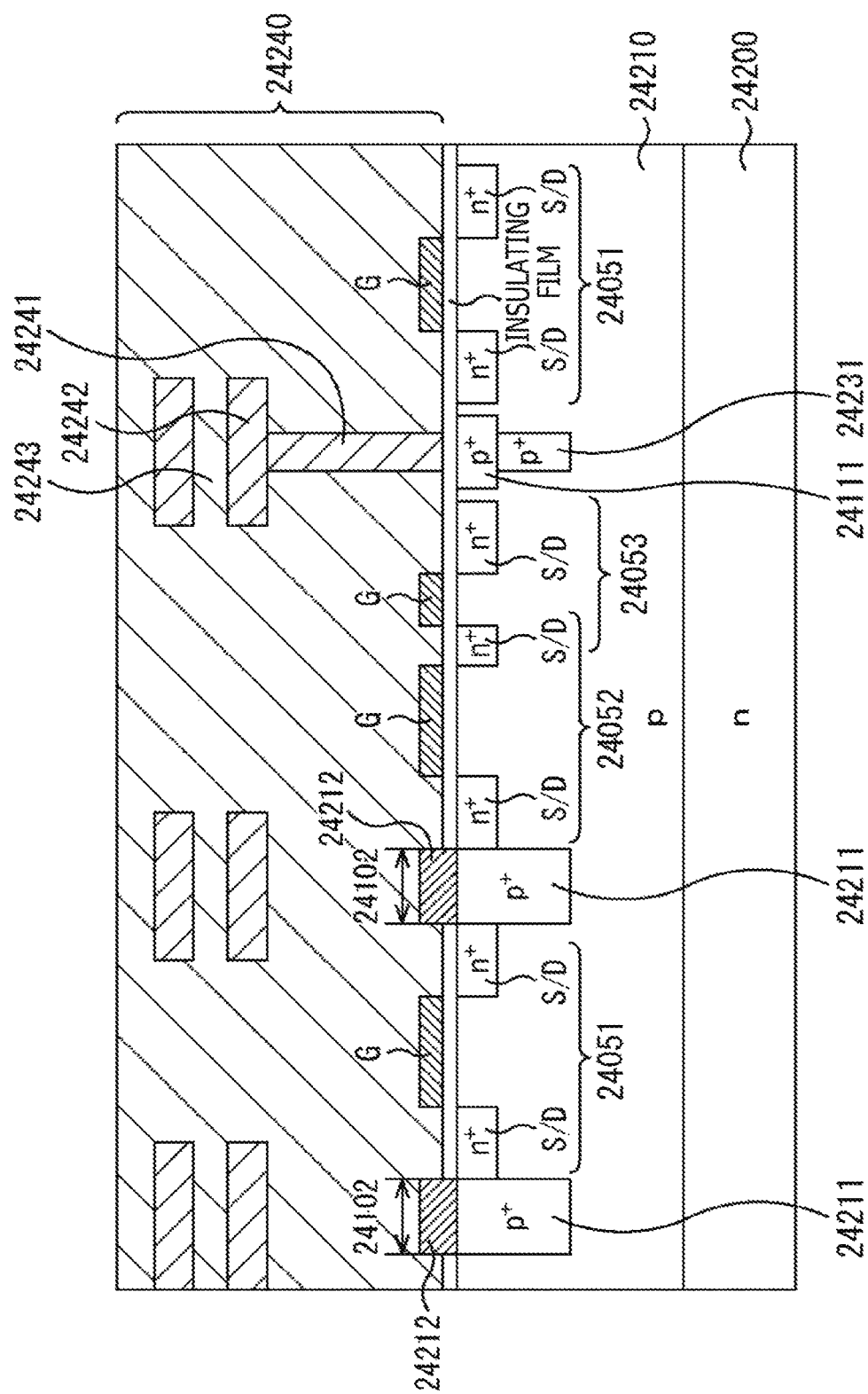
FIG. 26 is a cross-sectional view of the first configuration example of the solid-state imaging apparatus to which a technology according to the present disclosure is applicable and which has a plurality of sharing pixels.

FIG. 25 is a plan view of a first configuration example of a solid-state imaging apparatus to which a technology according to the present disclosure is applicable and which has a plurality of sharing pixels. FIG. 26 is a cross-sectional view taken along line A-A in FIG. 25.

A solid-state imaging apparatus 24010 has a pixel region 24011 in which pixels are arranged in a two-dimensional array. The pixel region 24011 is formed by arranging, in a two-dimensional array, sharing pixel units 24012 in each of which a pixel Tr (MOS FET), etc., is shared by four pixels consisting of two pixels in the row direction×two pixels in the column direction.

The four pixels included in each sharing pixel unit 24012 having four sharing pixels in which four pixels consisting of two pixels in the row direction×two pixels in the column direction are common, include PDs (photodiodes) $24021_1$, $24021_2$, $24021_3$, and $24021_4$, respectively, and share one FD (floating diffusion) 24030. In addition, the sharing pixel unit 24012 includes a transfer Tr $24041_i$, as a pixel Tr, corresponding to the PD $24021_i$ (here, i=1, 2, 3, 4), a reset Tr 24051 as a common Tr that is shared by the four pixels, an amplification Tr 24052, and a selection Tr 24053.

The FD 24030 is disposed at the center surrounded by the four PDs $24021_1$ to $24021_4$. The FD 24030 is connected to a source/drain region S/D serving as a drain of the reset Tr 24051 and to a gate G of the amplification Tr 24052, through a wiring 24071. The Tr $24041_i$ includes a gate $24042_i$ that is disposed between the PD $24021_i$ corresponding to the transfer Tr $24041_i$ and the FD 24030 close to the PD $24021_i$, and is operated according to a voltage applied to the gate $24042_i$.

Here, a region including the PDs $24021_1$ to $24021_4$, the FDs 24030, and the transfer Trs $24041_1$ to $24041_4$ of the respective sharing pixel units 24012 in each row is referred to as a PD formation region 24061. Also, a region including the reset Trs 24051, the amplification Trs 24052, and the selection Trs 24053, which are shared by the corresponding four-pixel units, among the Trs of the respective sharing pixel units 24012 in each row, is referred to as a Tr formation region 24062. The Tr formation regions 24062 and the PD formation regions 24061, which are continuous in the horizontal direction, are alternately arranged in the vertical direction of the pixel region 24011.

The reset Tr 24051, the amplification Tr 24052, and the selection Tr 24053 are each formed of a pair of source/drain regions S/D and a gate G. One of the pair of source/drain regions S/D functions as a source, and the other source/drain region S/D functions as a drain.

The PDs $24021_1$ to $24021_4$, the FD 24030, the transfer Trs $24041_1$ to $24041_4$, the reset Tr 24051, the amplification Tr 24052, and the selection Tr 24053 are formed in a p-type semiconductor region (p-well) 24210 that is formed on an n-type semiconductor substrate 24200, as depicted in the cross-sectional view in FIG. 26, for example.

As depicted in FIG. 25, a pixel separation part 24101 is formed in the PD formation region 24061, and an element separation part 24102 is formed in (a region including) the Tr formation region 24062. The element separation part 24102 is formed of a p-type semiconductor region 24211 provided in the p-type semiconductor region 24210, and an insulating film (e.g., a silicon oxide film) 24212 provided on a surface of the p-type semiconductor region 24211, as depicted in FIG. 26, for example. The pixel separation part 24101 (not depicted) can be similarly formed.

A well contact 24111 for applying a fixed voltage to the p-type semiconductor region 24210 is formed in the pixel region 24011. The well contact 24111 can be formed as a p-type semiconductor region that is an impurity diffusion region provided on a surface of a p-type semiconductor region 24231 which is provided in the p-type semiconductor region 24210. The well contact 24111 is a p-type semiconductor region that has a higher impurity concentration than the p-type semiconductor region 24231. The well contact 24111 (and the p-type semiconductor region 24231 under the well contact 24111) also serves as the element separation part 24102, and is formed between the respective common Trs (reset Trs 24051, the amplification Trs 24052, and the selection Trs 24053) of the sharing pixel units 24012 adjacent to each other in the row direction. The well contact 24111 is connected to a prescribed wiring 24242 of a wiring layer 24240 through a conductive via 24241. A prescribed fixed voltage is applied from the wiring 24242 to the p-type semiconductor region 24210 through the conductive via 24241 and the well contact 24111. The wiring layer 24240 is formed by arranging a plurality of the wirings 24242 with the insulating film 24243 interposed thereamong. A CF (color filter) and a microlens are formed on the wiring layer 24240 with a flattened film interposed therebetween (not depicted).

Figure 27:
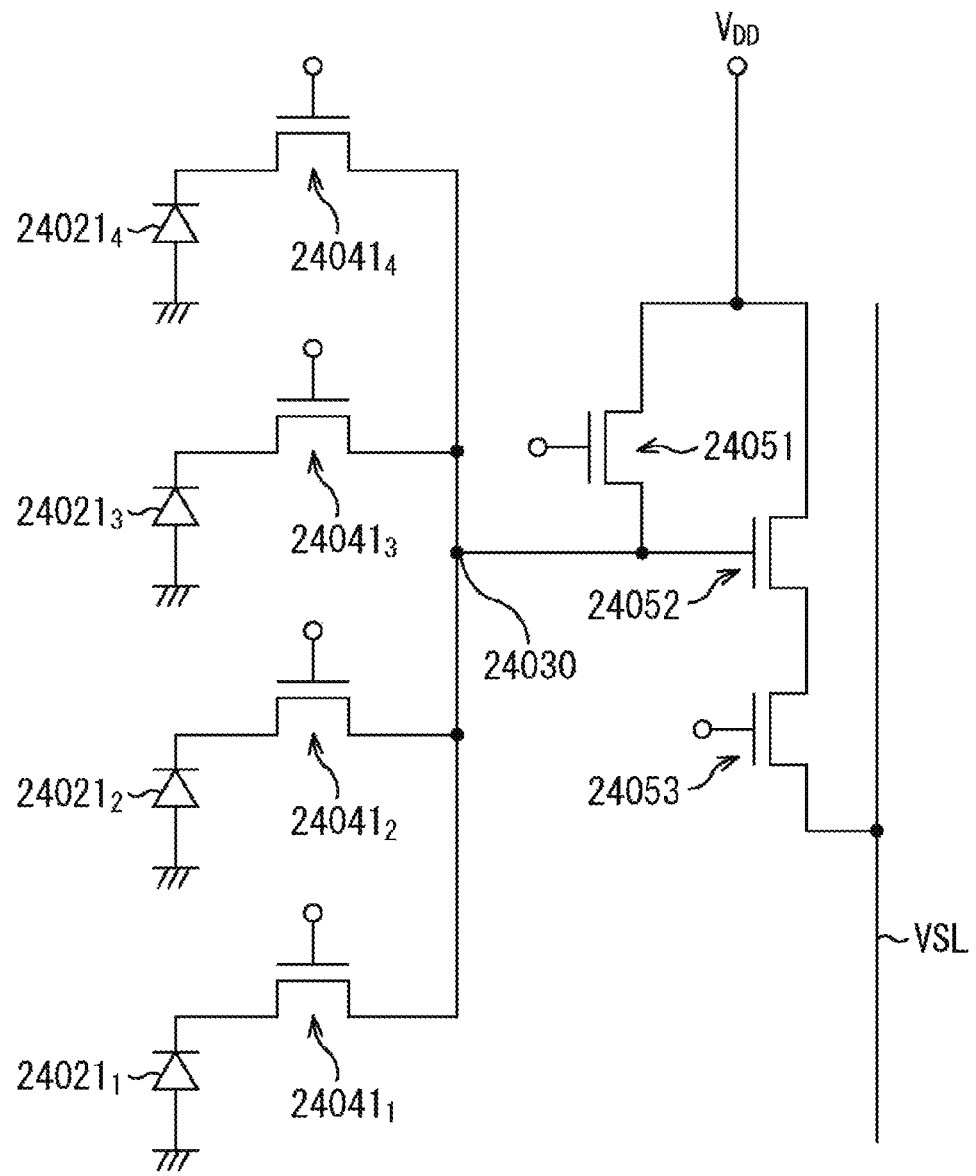
FIG. 27 is a diagram depicting an example of an equivalent circuit of a sharing pixel unit having four sharing pixels.

FIG. 27 is a diagram depicting an example of an equivalent circuit of the sharing pixel unit 24012 having four sharing pixels. In an equivalent circuit of the sharing pixel unit 24012 having four sharing pixels, the four PDs $24021_1$ to $24021_4$ are connected to sources of the transfer Trs $24041_1$ to $24041_4$, respectively. A drain of the each transfer Tr $24041_i$ is connected to a source of the reset Tr 24051. The respective drains of the transfer Trs $24041_i$ constitute the common FD 24030. The FD 24030 is connected to a gate of the amplification Tr 24052. A source of the amplification Tr 24052 is connected to a drain of the selection Tr 24053. A drain of the reset Tr 24051 and a drain of the amplification Tr 24052 are connected to a power source VDD. A source of the selection Tr 24053 is connected to a VSL (vertical signal line). Here, each of the reset Tr 25051, the amplification Tr 24052, and the selection Tr 24053 may be formed of a plurality of transistors.

Figure 28:
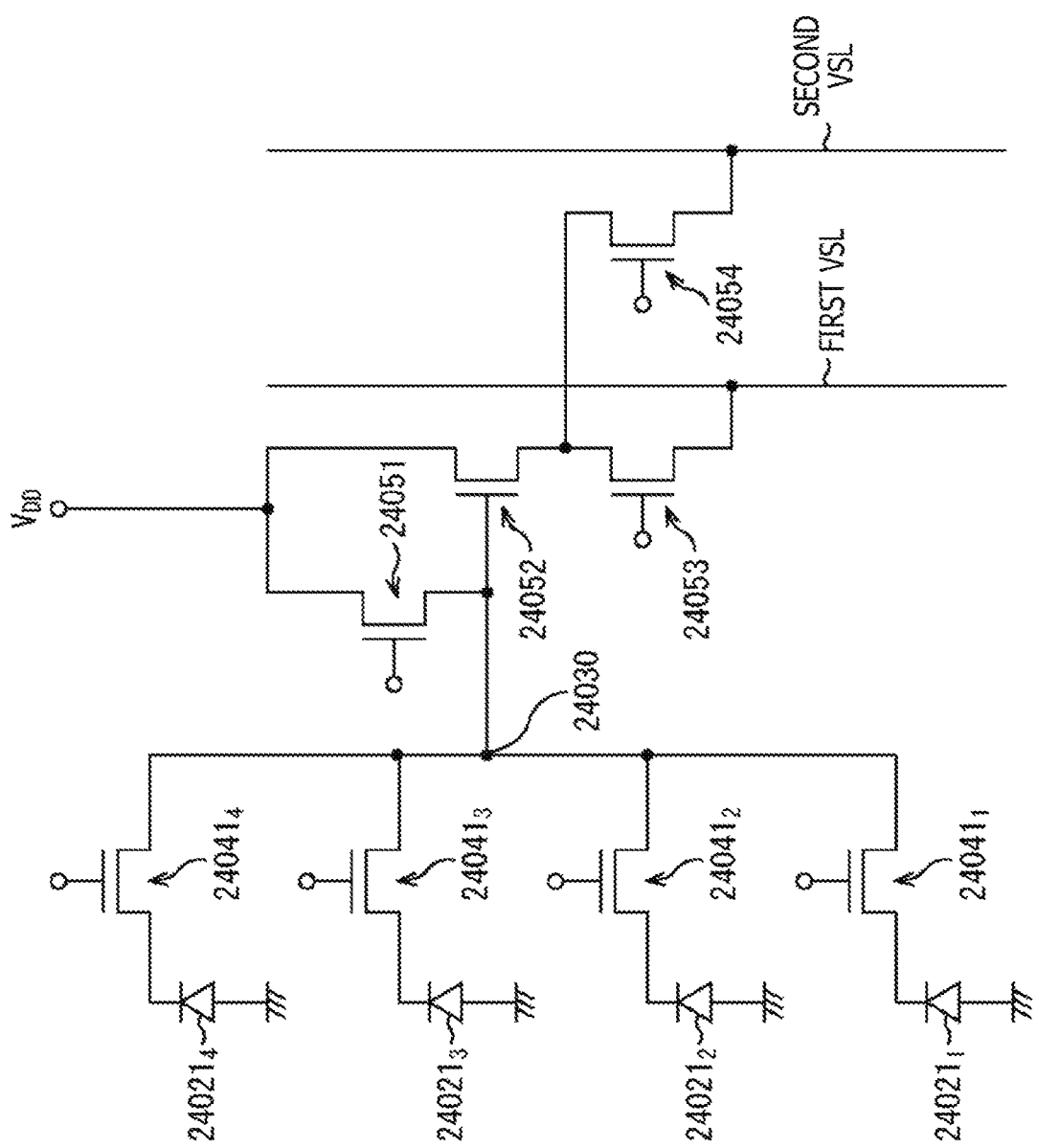
FIG. 28 is a diagram depicting another example of an equivalent circuit of a sharing pixel unit having four sharing pixels.

FIG. 28 is a diagram depicting another example of an equivalent circuit of the sharing pixel unit 24012 having four sharing pixels. The equivalent circuit in FIG. 28 is configured similar to that in FIG. 27, except for a point in which plural (two) of selection Trs which are a first selection Tr 24053 and a second selection Tr 24054, are provided in place of one selection Tr 24053, and plural (two) of VSLs which are a first VSL and a second VSL are provided in place of one VSL. In FIG. 28, a source of the amplification Tr 24052 is connected to a drain of the first selection Tr 24053 and to a drain of the second selection Tr 24054, a source of the first selection Tr 24053 is connected to the first VSL, and a source of the second selection Tr 24054 is connected to the second VSL.

Figure 29:
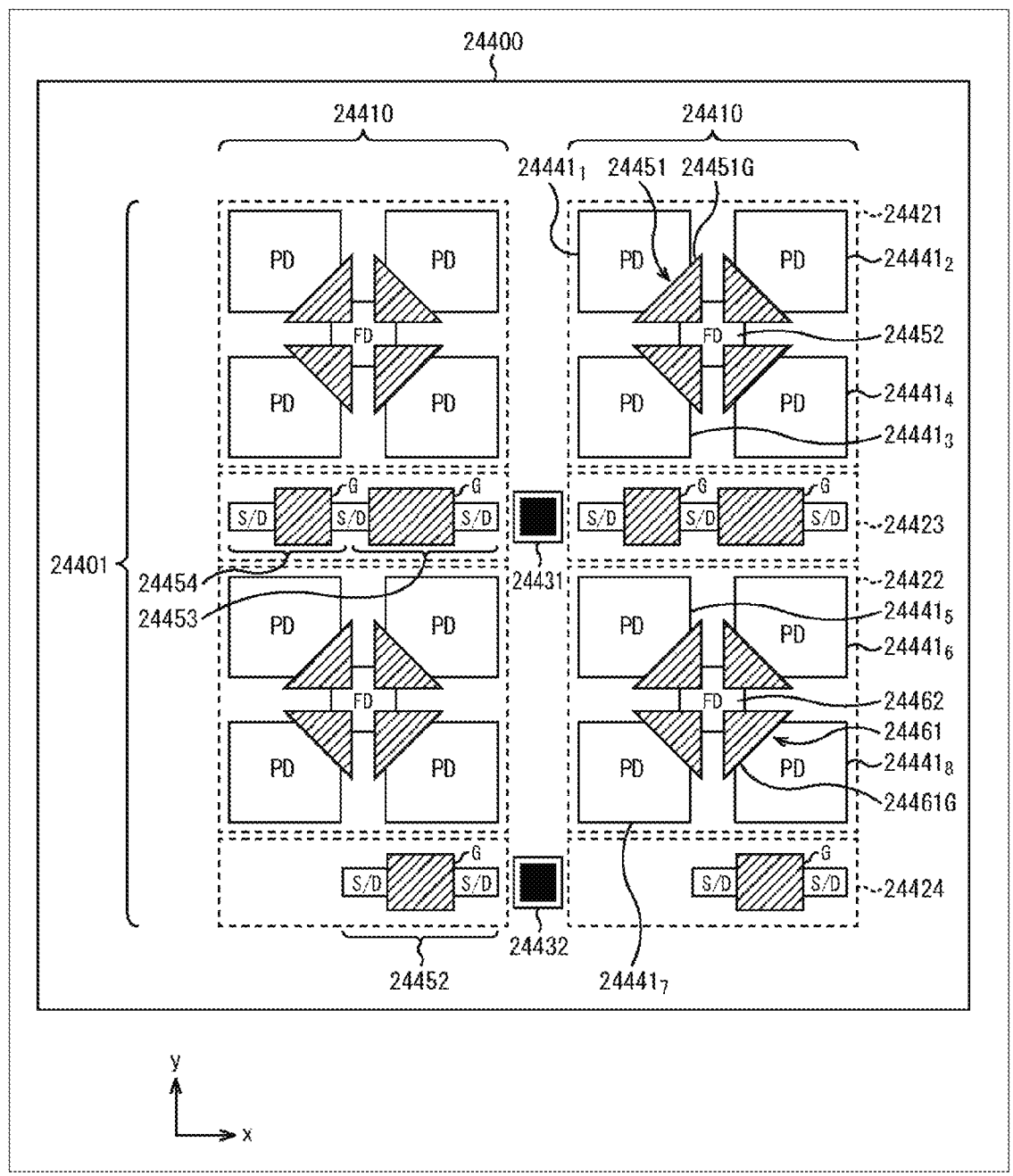
FIG. 29 is a plan view of a second configuration example of a solid-state imaging apparatus to which a technology according to the present disclosure is applicable and which has a plurality of sharing pixels.

FIG. 29 is a plan view of a second configuration example of a solid-state imaging apparatus to which a technology according to the present disclosure and which has a plurality of sharing pixels.

A solid-state imaging apparatus 24400 has a pixel region 24401 in which pixels are arranged in a two-dimensional array. The pixel region 24401 is formed by arranging, in a two-dimensional array, sharing pixel units 24410 that are each formed of eight pixels consisting of two pixels in the row direction×four pixels in the column direction.

Each sharing pixel unit 24410 having eight sharing pixels consisting of two pixels in the row direction×four pixels in the column direction, includes a first light receiving section 24421 and a second light receiving section 24422. The first light receiving section 24421 and the second light receiving section 24422 are arranged side by side in the column direction (y direction) in each of the sharing pixel units 24410.

The first light receiving section 24421 includes PDs $24441_1$, $24441_2$, $24441_3$, and $24441_4$, which are arranged in two pixels in the row direction×two pixels in the column direction, four transfer Trs 24451 corresponding to the PDs $24441_1$ to $24441_4$, and an FD 24452 that is shared by the PDs $24441_1$ to $24441_4$. The FD 24452 is disposed at the center among the PD $24441_1$ to $24441_4$.

The second light receiving section 24422 includes PDs $24441_5$, $24441_6$, $24441_7$, and $24441_8$, which are arranged in two pixels in the row direction×two pixels in the column direction, four transfer Trs 24461 corresponding to the PDs $24441_5$ to $24441_8$, and an FD 24462 that is shared by the PDs $24441_5$ to $24441_8$. The FD 24462 is disposed at the center among the PD $24441_5$ to $24441_8$.

Each of the transfer Trs 24451 includes a gate 24451G disposed between a PD $24441_i$ corresponding to the transfer Tr 24451 and the FD 24452, and is operated according to a voltage applied to the gate 24451G. Similarly, each of the transfer Trs 24461 includes a gate 24461G disposed between a PD $24441_i$ corresponding to the transfer Tr 24461 and the FD 24462, and is operated according to a voltage applied to the gate 24461G.

Further, each sharing pixel unit 24410 includes a first Tr group 24423 and a second Tr group 24424. In the first Tr group 24423 and the second Tr group 24424, a reset Tr 24452, an amplification Tr 24453, and a selection Tr 24454 are disposed as common Trs which are shared by eight pixels of the sharing pixel unit 24410. In FIG. 29, the amplification Tr 24453 and the selection Tr 24454 are disposed in the first Tr group 24423, and the reset Tr 24452 is disposed in the second Tr group 24424. Like the first selection Tr 24053 and the second selection Tr 24054 in FIG. 28, each of the reset Tr 25051, the amplification Tr 24052, and the selection Tr 24053 may be formed of a plurality of transistors (not depicted). In addition, for example, in the case where the selection Tr 24053 is formed of a plurality of transistors, different VSLs can be connected to the plurality of transistors constituting the selection Tr 24053, as depicted in FIG. 28.

The first Tr group 24423 is disposed between the first light receiving section 24421 and the second light receiving section 24422. The second Tr group 24424 is disposed in a region, in the peripheral region of the second light receiving section 24422, opposite to a side on which the first Tr group 24423 is disposed in the second light receiving section 24422.

In the first Tr group 24423 and the second Tr group 24424, the reset Tr 24452, the amplification Tr 24453, and the selection Tr 24454 are each formed of a pair of source/drain regions S/D and a gate G. One of the pair of source/drain regions S/D functions as a source, and the other source/drain region S/D functions as a drain.

The pair of source/drain regions S/D and the gate G constituting each of the reset Tr 24452, the amplification Tr 24453, and the selection Tr 24454, are arranged side by side in the row direction (x direction). The gate G constituting the reset Tr 24452 is disposed in a region that is substantially opposed, in the column direction (y direction), to the PD 24441$_8$ disposed on the lower right side in the second light receiving section 24422.

A first well contact 24431 and a second well contact 24432 are disposed between two sharing pixel units 24410 which are arranged side by side in the row direction. The first light receiving section 24421, the second light receiving section 24422, the first Tr group 24423, and the second Tr group 24424 are formed in a semiconductor region that is a prescribed well region formed in a Si substrate. The first well contact 24431 and the second well contact 24432 are contacts for electrically connecting the prescribed well region to an internal wiring in the solid-state imaging apparatus 24400. The first well contact 24431 is disposed between the respective first Tr groups 24423 of two sharing pixel units 24410 which are arranged side by side in the row direction. The second well contact 24432 is disposed between the respective second Tr groups 24424 of two sharing pixel units 24410 which are arranged side by side in the row direction.

Further, the sections in each of the sharing pixel units 24410 are electrically connected to one another such that a connection relation conforming to the equivalent circuit having four sharing pixels depicted in FIG. 27 is satisfied.

Figure 30:
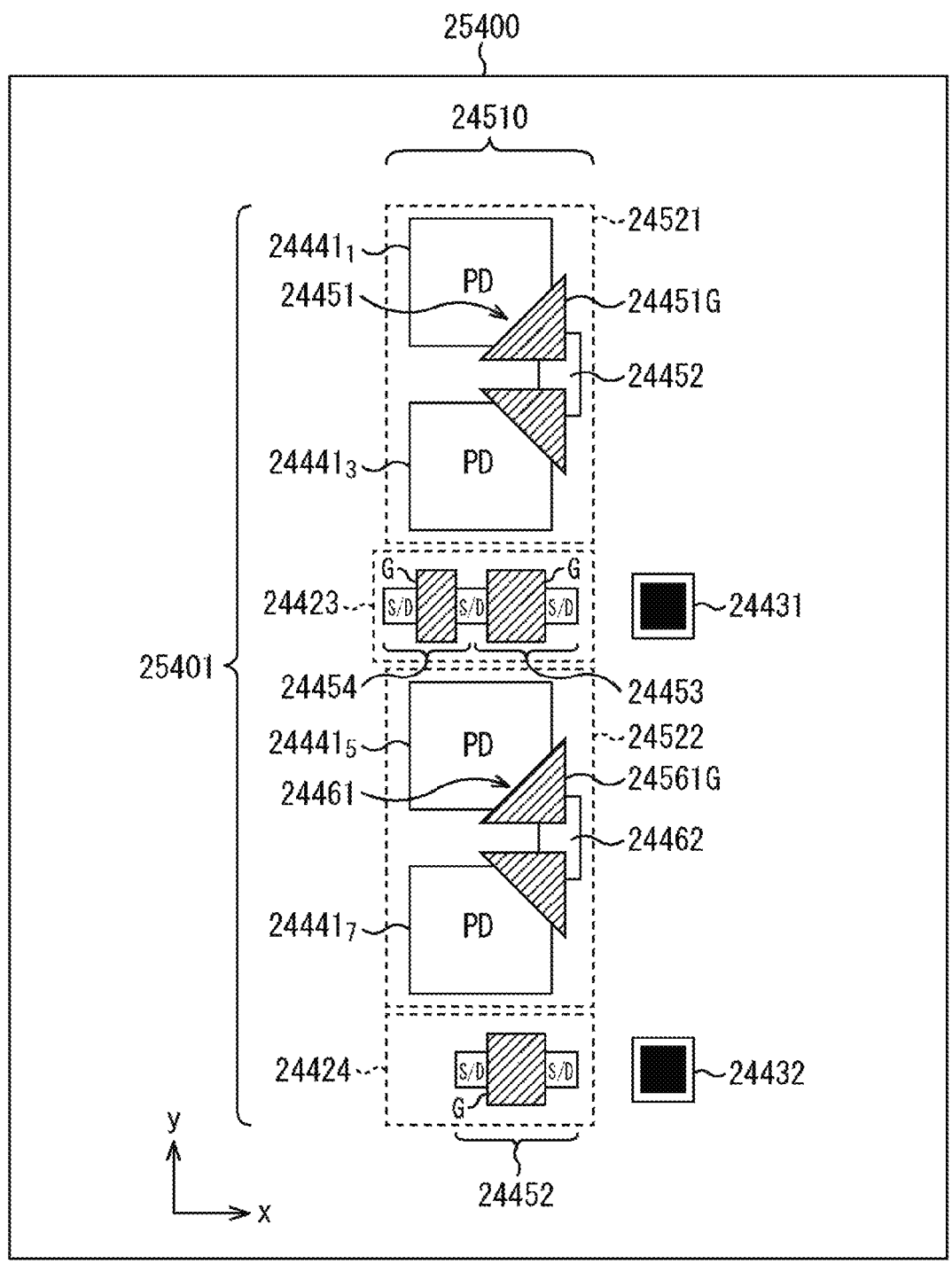
FIG. 30 is a plan view of a third configuration example of a solid-state imaging apparatus to which a technology according to the present disclosure is applicable and which has a plurality of sharing pixels.

FIG. 30 is a plan view of a third configuration example of a solid-state imaging apparatus to which a technology according to the present disclosure and which has a plurality of sharing pixels.

A solid-state imaging apparatus 25400 includes a pixel region 25401 in which pixels are arranged in a two-dimensional array. The pixel region 25401 is formed by arranging, in a two-dimensional array, sharing pixel units 24510 which are each formed of four pixels consisting of one pixel in the row direction×four pixels in the column direction.

The pixel region 25401 includes the first well contact 24431 and the second well contact 24432 in addition to the sharing pixel units 24510. Regarding the point of including the first well contact 24431 and the second well contact 24432, the pixel region 25401 is the same as the pixel region 24401 in FIG. 29. However, the pixel region 25401 is different from the pixel region 24401 in that the pixel region 25401 includes the sharing pixel units 24510 which are each formed of one pixel in the row direction×four pixels in the column direction, in place of the sharing pixel units 24410 which are each formed of two pixels in the row direction× four pixels in the column direction in FIG. 29.

The sharing pixel units 24510 each include a first light receiving section 24521, a second light receiving section 24522, the first Tr group 24423, and the second Tr group 24424. Regarding the point of including the first Tr group 24423 and the second Tr group 24424, the sharing pixel units 24510 are the same as the sharing pixel units 24410 in FIG. 29. However, the common pixel units 24510 are different from the sharing pixel units 24410 in FIG. 29 in that the common pixel units 24510 each include the first light receiving section 24521 and the second light receiving section 24522, in place of the first light receiving section 24421 and the second light receiving section 24422.

The first light receiving section 24521 includes the PDs 24441$_1$ and 24441$_3$ which are arranged in one pixel in the row direction×two pixels in the column direction, two transfer Trs 24451 corresponding to the PDs 24441$_1$ and 24441$_3$, and the FD 24452. Regarding the point of including the PDs 24441$_1$ and 24441$_3$, two transfer Trs 24451 corresponding to the PDs 24441$_1$ and 24441$_3$, and the FD 24452, the first light receiving section 24521 is the same as the first light receiving section 24421 in FIG. 29. However, the first light receiving section 24521 is different from the first light receiving section 24421 in FIG. 29 in that the first light receiving section 24521 does not include the PDs 24441$_2$ and 24441$_4$ and two transfer Trs 24451 corresponding to the PDs 24441$_2$ and 24441$_4$.

The second light receiving section 24522 includes the PDs 24441$_5$ and 24441$_7$ which are arranged in one pixel in the row direction×two pixels in the column direction, two transfer Trs 24461 corresponding to the PDs 24441$_5$ and 24441$_7$, and the FD 24462. Regarding the point of including the PDs 24441$_5$ and 24441$_7$, the two transfer Trs 24461 corresponding to the PDs 24441$_5$ and 24441$_7$, and the FD 24462, the second light receiving section 24522 is the same as the second light receiving section 24422 in FIG. 29. However, the second light receiving section 24522 is different from the second light receiving section 24422 in FIG. 29 in that the second light receiving section 24522 does not include the PDs 24441$_6$ and 24441$_8$ and two transfer Trs 24461 corresponding to the PDs 24441$_6$ and 24441$_8$.

It is to be noted that, in each of the sharing pixel units 24510, the gate G constituting the reset Tr 24452 is disposed in a region that is substantially opposed, in the column direction (y direction), to the left side of the PD 24441$_7$ in the second light receiving section 24522.

Further, the sections in each of the sharing pixel units 24510 are electrically connected to one another such that a connection relation conforming to the equivalent circuit having four sharing pixels depicted in FIG. 27 is satisfied.

A technology according to the present disclosure is applicable to solid-state imaging apparatuses such as those described so far.

<12. Plan Configuration Example of Solid-State Imaging Apparatus to which Technology According to Present Disclosure is Applicable and which Includes Pixels Having Layered Photoelectric Conversion Sections>

Figure 31:
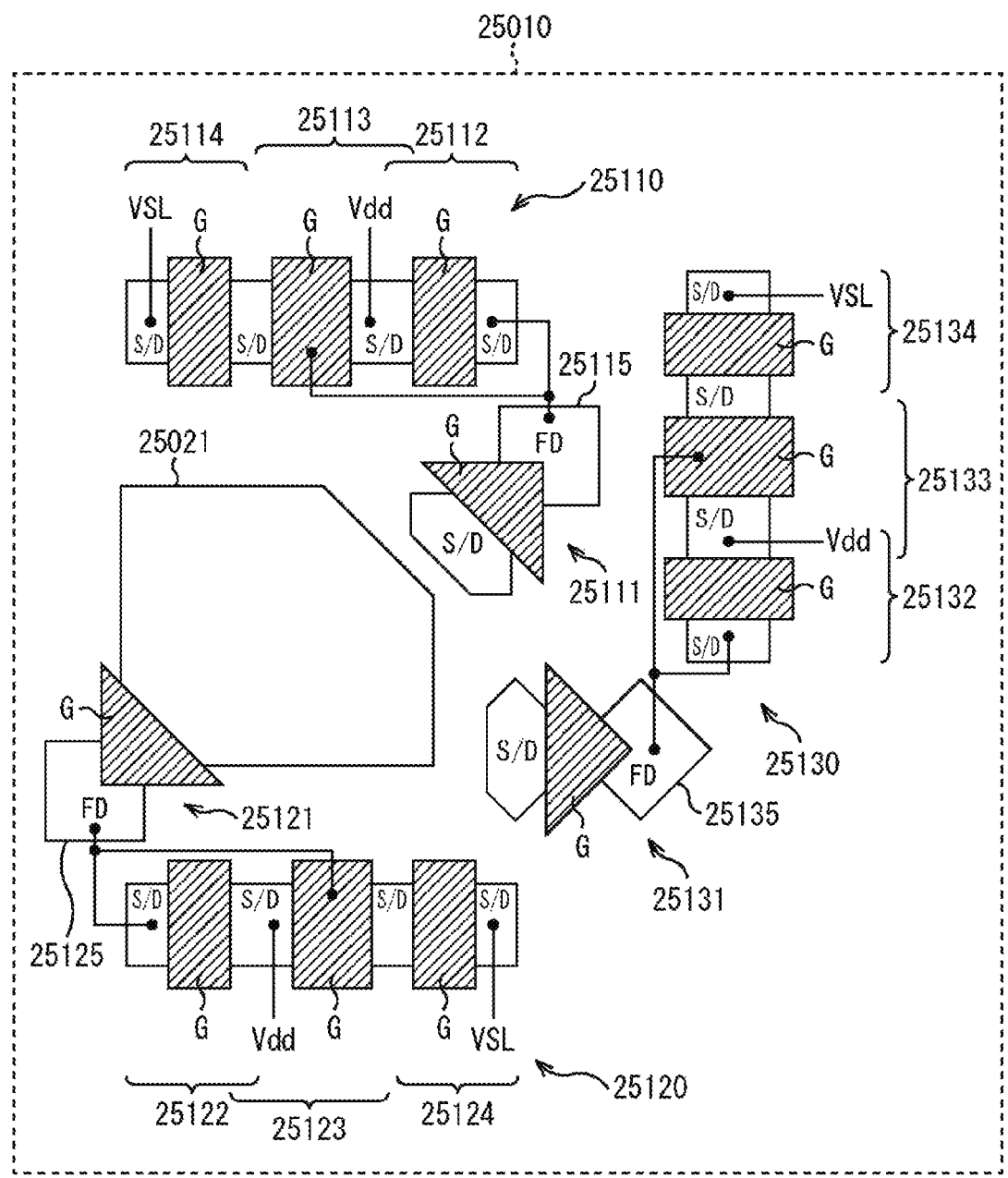
FIG. 31 is a plan view of a configuration example of a solid-state imaging apparatus to which a technology according to the present disclosure is applicable and which includes a pixel having layered photoelectric conversion sections.

FIG. 31 is a plan view of a configuration example of a solid-state imaging apparatus to which a technology according to the present disclosure is applicable and which includes pixels having layered photoelectric conversion sections.

That is, FIG. 31 depicts a configuration example of one pixel of a solid-state imaging apparatus that includes pixels having layered photoelectric conversion sections.

A pixel 25010 includes a photoelectric conversion region 25021 in which a red photoelectric conversion section, a green photoelectric conversion section, and a blue photoelectric conversion section (which are not depicted) that perform photoelectric conversion of light having wavelengths of R (Red), G (Green), and B (Blue), respectively, are layered in the order of, for example, the green photoelectric conversion section, the blue photoelectric conversion section, and the red photoelectric conversion section. Further, the pixel 25010 includes Tr groups 25110, 25120, and 25130 that serve as charge reading-out sections for reading out charges respectively corresponding to light having the RGB wavelengths, from the red photoelectric conversion section, the green photoelectric conversion section, and the blue photoelectric conversion section. In the one pixel 25010 of the solid-state imaging apparatus, vertical spectroscopy is performed, that is, spectroscopy of R-light, G-light, and B-light are performed respectively in the red photoelectric conversion section, the green photoelectric conversion section, and the blue photoelectric conversion section which are layered in the photoelectric conversion region 25021.

The Tr groups 25110, 25120, and 25130 are formed in the periphery of the photoelectric conversion region 25021. The Tr group 25110 outputs, as a pixel signal, a signal charge that is generated and stored in the red photoelectric conversion section and that corresponds to R-light. The Tr group 25110 is formed of a transfer Tr (MOS FET) 25111, a reset Tr 25112, an amplification Tr 25113, and a selection Tr 25114. The Tr group 25120 outputs, as a pixel signal, a signal charge that is generated and stored in the green photoelectric conversion section and that corresponds to G-light. The Tr group 25120 is formed of a transfer Tr 25121, a reset Tr 25122, an amplification Tr 25123, and a selection Tr 25124. The Tr group 25130 outputs, as a pixel signal, a signal charge that is generated and stored in the blue photoelectric conversion section and that corresponds to B-light. The Tr group 25130 is formed of a transfer Tr 25131, a reset Tr 25132, an amplification Tr 25133, and a selection Tr 25134.

The transfer Tr 25111 is formed of a gate G, a source/drain region S/D, and (a source/drain region that serves as) an FD (floating diffusion) 25115. The transfer Tr 25121 is formed of a gate G, (a source/drain region constituting) the green photoelectric conversion section of the photoelectric conversion region 25021, and an FD 25125. The transfer Tr 25131 is formed of a gate G, a source/drain region S/D, and an FD 25135. It is to be noted that the source/drain region S/D of the transfer Tr 25111 is connected to the red photoelectric conversion section in the photoelectric conversion region 25021, and the source/drain region S/D of the transfer Tr 25131 is connected to the blue photoelectric conversion section in the photoelectric conversion region 25021.

The reset Trs 25112, 25122, and 25132, the amplification Trs 25113, 25123, and 25133, and the selection Trs 25114, 25124, and 25134 are each formed of a gate G and a pair of source/drain regions S/D that are disposed so as to sandwich the gate G.

The FDs 25115, 25125, and 25135 are respectively connected to source/drain regions S/D that respectively serve as sources of the reset Trs 25112, 25122, and 25132, and are respectively connected to the gates G of the amplification Trs 25113, 25123, and 25133. The source/drain region S/D shared by the reset Tr 25112 and the amplification Tr 25113, the source/drain region S/D shared by the reset Tr 25122 and the amplification Tr 25123, and the source/drain region S/D shared by the reset 25132 and the amplification Tr 25133, are each connected to a power source Vdd. The source/drain regions S/D serving as sources of the selection Trs 25114, 25124, and 25134 are each connected to a VSL (vertical signal line).

A technology according to the present disclosure is applicable to a solid-state imaging apparatus such as that described so far.

Embodiments according to the present technology are not limited to the aforementioned embodiments, and various modifications can be made within the gist of the present technology.

It is to be noted that the effects described in the present description are just examples, and thus, are not limited. Therefore, another effect may be provided.

<Others>

The present technology may have the following configurations.

(1)

A substrate including:

a second region that is disposed inside a first region in which a semiconductor component is arranged and that is surrounded by a connection part and a slit, the connection part having a spot facing on a side of a surface on which the semiconductor component is arranged.

(2)

The substrate according to (1), in which the second region is a center region of the substrate.

(3)

The substrate according to (1) or (2), in which a waste substrate, which is the second region part of the substrate, is separated off from the substrate.

(4)

The substrate according to any one of (1) to (3), in which the spot facing is provided in an entirety of the connection part.

(5)

The substrate according to any one of (1) to (4), in which the semiconductor component is arranged on the substrate.

(6)

The substrate according to any one of (1) to (5), in which the semiconductor component includes a package including a sensor substrate that captures an image by performing photoelectric conversion of light.

(7)

The substrate according to (6), in which the sensor substrate is connected to an electrode by wire bonding.

(8)

The substrate according to (6) or (7), in which the sensor substrate is sealed in a space that is surrounded by a base on which the sensor substrate is arranged and by a glass which is disposed on an upper portion of the base.

(9)

The substrate according to (3), in which a heat sink that radiates heat is disposed so as to be brought into contact with the semiconductor component exposed from an opening that is formed in the substrate after the waste substrate is separated off.

(10)

A package substrate manufacturing method including:

mounting, on a semiconductor component, a substrate including a second region that is disposed inside a first region in which the semiconductor component is arranged and that is surrounded by a connection part and a slit, the connection part having a spot facing on a side of a surface on which the semiconductor component is arranged; and separating off a waste substrate, which is the second region part of the substrate, from the substrate, by cutting the connection part.

(11)

The package substrate manufacturing method according to (10), in which the substrate is mounted on the semiconductor component after a component other than the semiconductor component is mounted on the substrate.

(12)

The package substrate manufacturing method according to (10) or (11), in which the substrate is mounted on the semiconductor component while the second region part of the substrate is being suctioned.

(13)

The package substrate manufacturing method according to any one of (10) to (12), in which a heat sink that radiates heat is mounted so as to be brought into contact with the semiconductor component exposed from an opening that is formed in the substrate after the waste substrate is separated off.

(14)

An electronic apparatus including:

an optical system that collects light; and an imaging section that captures an image by receiving the light, in which the imaging section is a package substrate that is obtained by mounting, on a semiconductor component that captures an image by performing photoelectric conversion of the light, a substrate including a second region that is disposed inside a first region in which the semiconductor component is arranged and that is surrounded by a connection part and a slit, the connection part having a spot facing on a side of a surface on which the semiconductor component is arranged, and separating off a waste substrate, which is the second region part of the substrate, from the substrate, by cutting the connection part.

REFERENCE SIGNS LIST

1 Package substrate, 10 Mounted component, 11 Base, 12 Sensor substrate, 13 Wire, 14 Glass, 15 Solder ball, 20 Substrate, 21 Opening, 30 Heat sink, 40 Substrate, 41 Slit, 42 Connection part, 43 Waste substrate, 51 Spot facing, 60 Router, 70 Opening, 80 Package substrate, 90 Jig, 91 Screen, 92 Cream solder, 93 Squeegee, 101 Imaging apparatus, 111 Optical system, 112 Imaging section, 113 Control circuit, 114 Signal processing circuit, 115 Monitor, 116 memory, R1 Arrangement region, R2 Suction region

The invention claimed is:

1. A substrate, comprising:

a first region on which a package is mountable; and a second region inside the first region, wherein a semiconductor component of the package is arranged in the first region, the second region is surrounded by a connection part and a slit, the connection part includes a recess on a first side of a surface on which the semiconductor component is arranged, the first region is separable from the second region by a router that is insertable into the connection part from a lower portion of the substrate to a depth that is less than a thickness of the substrate, and a width of the recess in a direction between the first region and the second region is narrower than a width of the connection part.

2. The substrate according to claim 1, wherein the second region is a center region of the substrate.

3. The substrate according to claim 1, wherein the second region of the substrate is separated off from the substrate as a waste substrate.

4. The substrate according to claim 3, wherein a heat sink that radiates heat is disposed so as to be brought into contact with the semiconductor component exposed from an opening that is formed in the substrate after the waste substrate is separated off.

5. The substrate according to claim 1, wherein the width of the recess is half the width of the connection part.

6. The substrate according to claim 1, wherein the semiconductor component is arranged on the substrate.

7. The substrate according to claim 1, wherein the semiconductor component includes a sensor substrate that captures an image by performing photoelectric conversion of light.

8. The substrate according to claim 7, wherein the sensor substrate is connected to an electrode by wire bonding.

9. The substrate according to claim 7, wherein the sensor substrate is sealed in a space that is surrounded by a base on which the sensor substrate is arranged and by a glass which is disposed on an upper portion of the base.

* * * * *